United States Patent
Chen et al.

(10) Patent No.: US 10,134,685 B1
(45) Date of Patent: Nov. 20, 2018

(54) INTEGRATED CIRCUIT PACKAGE AND METHOD OF FABRICATING THE SAME

(71) Applicant: Taiwan Semiconductor Manufacturing Co., Ltd., Hsinchu (TW)

(72) Inventors: Jie Chen, New Taipei (TW); Hsien-Wei Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/662,274

(22) Filed: Jul. 27, 2017

(51) Int. Cl.
| | |
|---|---|
| *H01L 23/552* | (2006.01) |
| *H01L 23/538* | (2006.01) |
| *H01L 23/31* | (2006.01) |
| *H01L 25/10* | (2006.01) |
| *H01L 21/48* | (2006.01) |
| *H01L 21/56* | (2006.01) |
| *H01L 25/00* | (2006.01) |

(52) U.S. Cl.
CPC .......... *H01L 23/552* (2013.01); *H01L 21/485* (2013.01); *H01L 21/486* (2013.01); *H01L 21/4853* (2013.01); *H01L 21/4857* (2013.01); *H01L 21/565* (2013.01); *H01L 23/3114* (2013.01); *H01L 23/5383* (2013.01); *H01L 23/5384* (2013.01); *H01L 23/5386* (2013.01); *H01L 23/5389* (2013.01); *H01L 25/105* (2013.01); *H01L 25/50* (2013.01); *H01L 2225/1035* (2013.01); *H01L 2225/1058* (2013.01)

(58) Field of Classification Search
CPC ... H01L 23/5384; H01L 25/50; H01L 23/552; H01L 23/5389; H01L 21/565; H01L 25/105; H01L 23/5385; H01L 21/486
USPC .......................................................... 257/659
See application file for complete search history.

(56) References Cited

U.S. PATENT DOCUMENTS

| 8,258,012 | B2 * | 9/2012 | Pagaila ............... H01L 23/5389 257/E21.001 |
| 8,299,595 | B2 * | 10/2012 | Yoon ..................... H01L 23/552 257/686 |
| 8,829,676 | B2 * | 9/2014 | Yu ......................... H01L 21/568 257/737 |
| 9,000,584 | B2 | 4/2015 | Lin et al. |
| 9,048,222 | B2 | 6/2015 | Hung et al. |

(Continued)

*Primary Examiner* — Luan C Thai
(74) *Attorney, Agent, or Firm* — JCIPRNET

(57) ABSTRACT

An integrated circuit package including at least one integrated circuit component, at least one electromagnetic interference shielding layer and an insulating encapsulation is provided. The at least one integrated circuit component includes an active surface, a plurality of sidewalls connected to the active surface and a plurality of conductive pillars protruding from the active surface. The at least one electromagnetic interference shielding layer covers the sidewalls of the at least one integrated circuit component, and the at least one electromagnetic interference shielding layer is electrically grounded. The insulating encapsulation encapsulates the at least one integrated circuit component and the at least one electromagnetic interference shielding layer, and the conductive pillars of the at least one integrated circuit component are accessibly exposed by the insulating encapsulation. Methods of fabricating the integrated circuit package are also provided.

20 Claims, 30 Drawing Sheets

(56) References Cited

U.S. PATENT DOCUMENTS

| | | |
|---|---|---|
| 9,048,233 B2 | 6/2015 | Wu et al. |
| 9,064,874 B2 | 6/2015 | Edelstein et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2016/0218072 A1* | 7/2016 | Liao ........................ H01L 23/66 |

\* cited by examiner

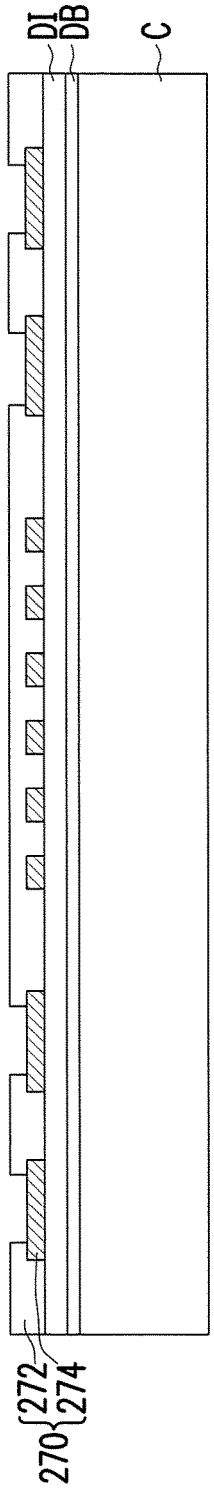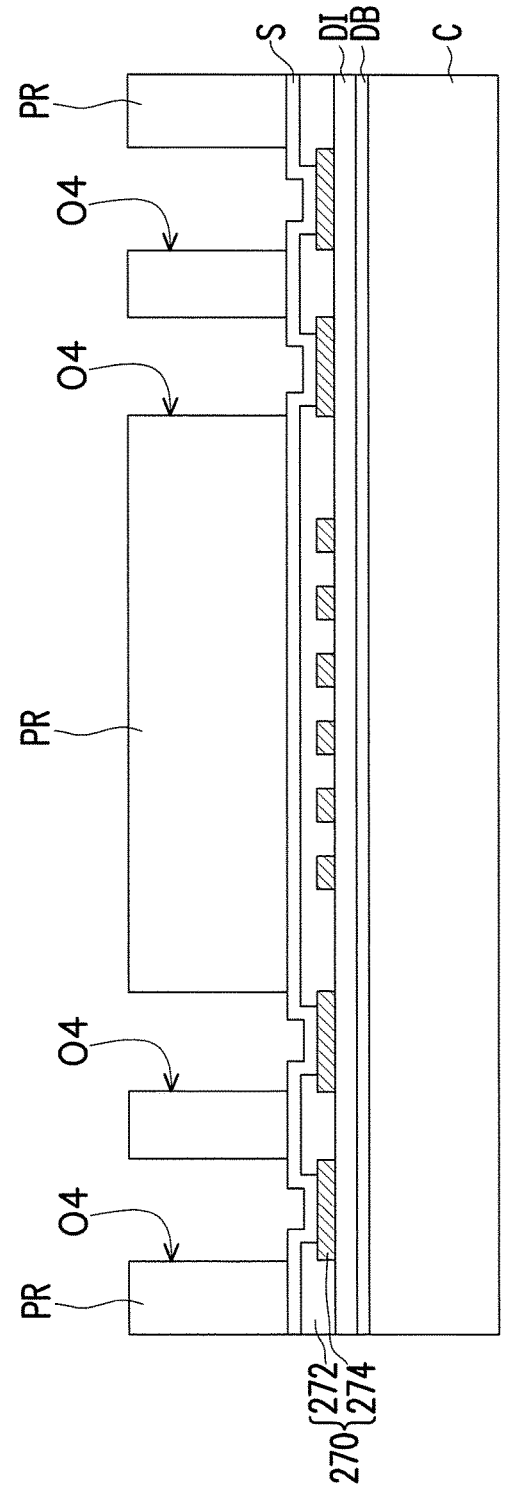

tegrated Circuit Package and
Method of Fabricating the Same

INTEGRATED CIRCUIT PACKAGE AND METHOD OF FABRICATING THE SAME

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness. In the currently fabricated integrated fan-out packages, an electromagnetic interference (EMI) shielding layer which is conformally formed on the appearance of the packages may be used to shield EMI from environment.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 15 through FIG. 25 schematically illustrate a process flow for fabricating an integrated fan-out package in accordance with some alternative embodiments of the present disclosure.

DETAILED DESCRIPTION

Figure 1:
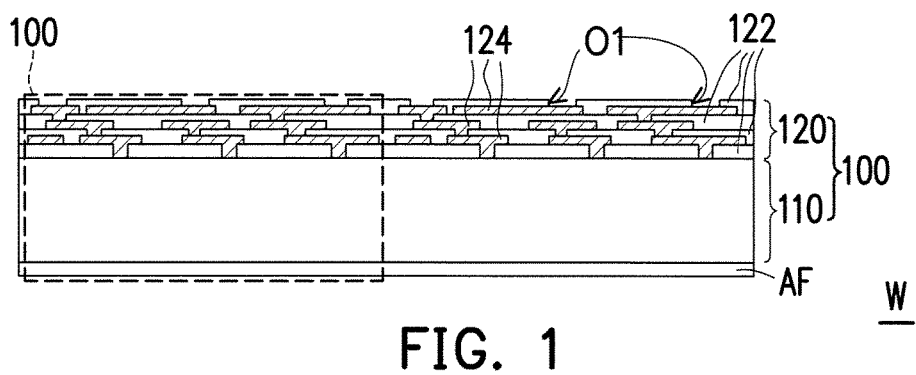
FIGS. 1 through 5 schematically illustrate a process flow for fabricating semiconductor dies in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1 through 5 schematically illustrate a process flow for fabricating semiconductor dies in accordance with some embodiments of the present disclosure.

Referring to FIG. 1, a wafer W including a plurality of integrated circuit components 100 arranged in an array is provided. Before performing a wafer sawing or dicing process on the wafer W, the integrated circuit components 100 of the wafer W are connected one another, as shown in FIG. 1. In some embodiments, each of the integrated circuit components 100 includes a semiconductor substrate 110 and an interconnection structure 120 disposed on the semiconductor substrate 110. The semiconductor substrate 110 may be a silicon substrate including active components (e.g., transistors or the like) and passive components (e.g., resistors, capacitors, inductors or the like) formed therein. The interconnection structure 120 may include a plurality of inter-dielectric layers 122 and a plurality of patterned conductive layers 124 stacked alternately. For example, the inter-dielectric layers 122 may be silicon oxide layers, silicon nitride layers, silicon oxy-nitride layers, or dielectric layers formed by other suitable dielectric materials, and the patterned conductive layers 124 may be patterned copper layers or other suitable patterned metal layers.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

As shown in FIG. 1, the topmost patterned conductive layer 124 is covered by the topmost inter-dielectric layer 122 of the inter-dielectric layers 120, and the topmost patterned conductive layer 124 is exposed by a plurality of openings O1 of the topmost inter-dielectric layer 124. Furthermore, the wafer W has a front surface and a back surface opposite to the front surface, wherein the topmost patterned conductive layer 124 is exposed at the front surface of the wafer W and an adhesion film AF is adhered with and entirely covers the back surface of the wafer W. In some embodiments, to facilitate the follow-up processes (e.g. plating process of conductive pillars, singulation process, and so on), the wafer W may be temporarily adhered with a support (not shown) via the adhesion film AF.

Figure 2:
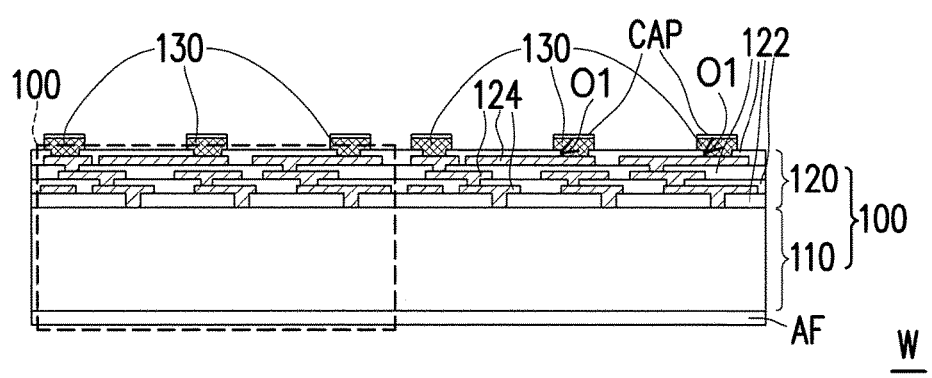

Referring to FIG. 2, a plurality of conductive pillars 130 are formed on the topmost patterned conductive layer 124 which is exposed by the openings O1. In some embodiments, the conductive pillars 130 may be formed by a plating process. In such embodiments, a seed layer (e.g., Ti/Cu seed layer) may be sputtered on the front surface of the wafer W first, and then a patterned photoresist having a predetermined pattern is formed on the seed layer. The wafer W having the seed layer and the patterned photoresist thereon is immersed into a plating bath such that the conductive pillars 130 are plated onto part area of the seed layer that is exposed by the patterned photoresist. The conductive pillars 130 are corresponding to the openings O1 of the topmost inter-dielectric layer 122. After the conductive pillars 130 are plated onto the exposed seed layer, the patterned photoresist is removed. Thereafter, the seed layer is patterned (e.g. etched) by using the conductive pillars 130 as a hard mask. The conductive pillars 130 may be copper pillars or other suitable metallic pillars.

As shown in FIG. 2, in order to inspect the electrical characteristics of the conductive pillars 130 and/or the integrated circuit components 100, a plurality of conductive caps CAP may be formed on top surfaces of the conductive pillars 130. In some embodiments, the conductive caps CAP may be solder caps. For example, the above-mentioned solder caps may be lead-free solder caps. Then, a chip-probing process is performed on the conductive caps CAP so as to inspect the electrical characteristics of the conductive pillars 130 and/or the integrated circuit components 100.

Figure 3:
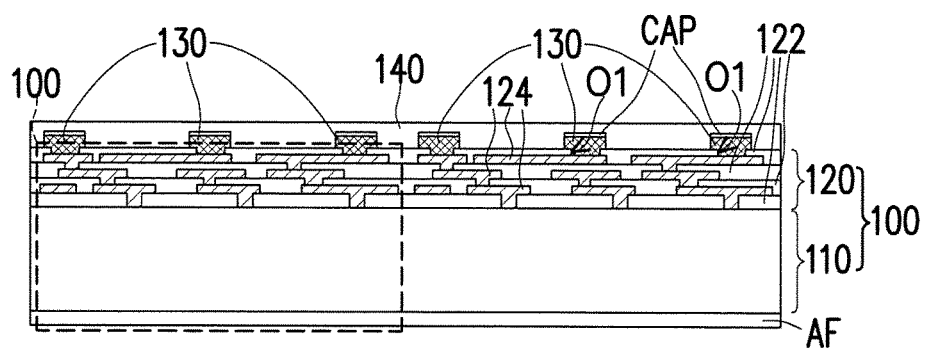

Referring to FIG. 3, a protection material layer 140 is formed over the front surface of the wafer W such that the conductive caps CAP and the conductive pillars 130 are encapsulated and protected by the protection material layer 140. As shown in FIG. 3, the protection material layer 140 has a substantially planar top surface, for example. In some embodiments, the protection material layer 140 may be a polyimide (PI) layer, a polybenzoxazole (PBO) layer, or other suitable polymer (or organic) layer formed to entirely covers the front surface of the wafer W to encapsulate the conductive caps CAP and the conductive pillars 130.

Figure 4:
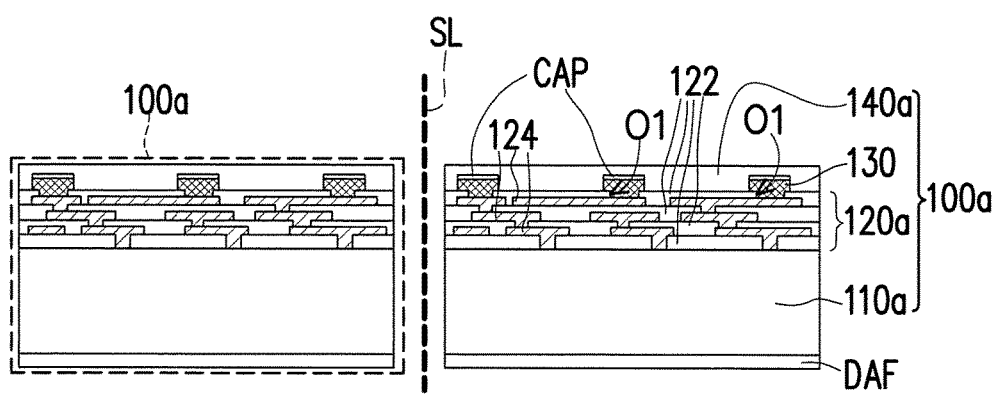

Referring to FIG. 4, after forming the protection material layer 140 over the front surface of the wafer W, a wafer dicing process or a wafer singulation process is performed such that the wafer W is cut along the scribe line SL and the wafer W is singulated into a plurality of semiconductor dies 100a. Each one of the singulated semiconductor dies 100a includes a semiconductor substrate 110a, an interconnection structure 120a disposed on the semiconductor substrate 110a, parts of the conductive pillars 130 and a protection cap 140a. The protection cap 140a encapsulates the parts of the conductive pillars 130 and covers the interconnection structure 120a. During the wafer dicing process, the conductive pillars 130 are protected by the protection cap 140a from damage.

During the wafer dicing process, the adhesion film AF adhered with the back surface of the wafer W is also cut into a plurality of die attachment films DAF and each of the die attachment films DAF is adhered with a back surface of the singulated semiconductor dies 100a, respectively. As shown in FIG. 4, the singulated semiconductor dies 100a are protected by the protection caps 140a and the die attachment films DAF.

Figure 5:
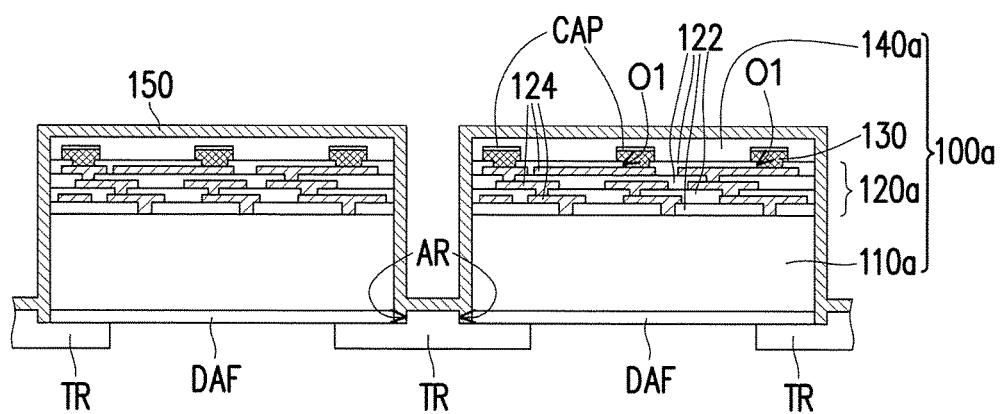

Referring to FIG. 5, after performing the wafer dicing process, the singulated semiconductor dies 100a are picked-up from the above-mentioned support and are placed on a tray TR. In some embodiments, the semiconductor dies 100a placed on the tray TR may be arranged in array and the semiconductor dies 100a may be adhered with the tray TR through the die attachment films DAF. In such embodiments, the tray TR may include a plurality of accommodating recesses AR arranged in array and each of the singulated semiconductor dies 100a is placed in one of the accommodating recesses AR, respectively. Due to the accommodating recesses AR of the tray TR, the singulated semiconductor dies 100a may be stably carried by the tray TR.

After the semiconductor dies 100a are placed on and temporarily adhered with the tray TR by the die attachment films DAF, a conductive layer 150 is conformally formed (e.g. deposited) on a top surface and sidewalls of each semiconductor die 100a. In some embodiments, the conductive layer 150 may further cover sidewalls of the die attachment films DAF and a top surface of the tray TR. For example, the conductive layer 150 may be deposited by a sputtering process or other suitable deposition processes. In addition, the material of the conductive layer 150 may include copper, aluminum or other suitable conductive materials capable of shielding electromagnetic interference. The thickness of the conductive layer 150 may range from about 1 micrometer to about 3 micrometers. It is noted that the conductive layer 150 is capable of shielding electromagnetic interference (EMI) from environment so as to ensure the performance of the semiconductor dies 100a.

In some embodiments, the adhesion between the tray TR and the die attachment films DAF is less than the adhesion between the semiconductor dies 100a and the die attachment films DAF such that the semiconductor dies 100a and the die attachment films DAF are capable of being picked-up and de-bonding from the tray TR.

FIG. 6 through FIG. 13 schematically illustrate a process flow for fabricating an integrated fan-out package in accordance with some embodiments of the present disclosure.

Figure 6:
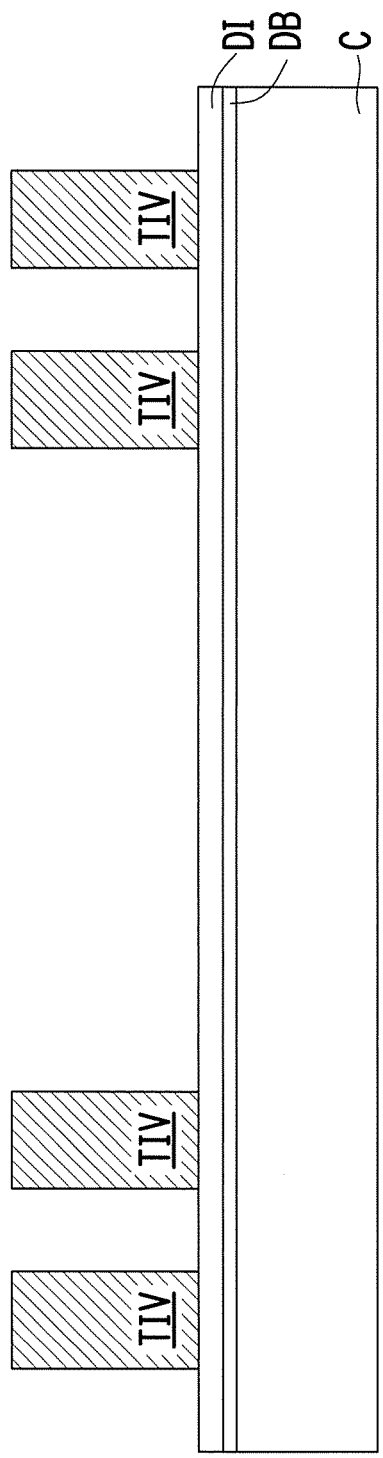
FIG. 6 through FIG. 13 schematically illustrate a process flow for fabricating an integrated fan-out package in accordance with some embodiments of the present disclosure.

Referring to FIG. 6, a carrier C having a de-bonding layer DB and a dielectric layer DI formed thereon is provided, wherein the de-bonding layer DB is between the carrier C and the dielectric layer DI. In some embodiments, the carrier C is a glass substrate, the de-bonding layer DB is a light-to-heat conversion (LTHC) release layer formed on the glass substrate, and the dielectric layer DI is a polybenzoxazole (PBO) layer formed on the de-bonding layer DB, for example. In alternative embodiments, the de-bonding layer DB may be a photo-curable release film whose stickiness is decreased by a photo-curing process or a thermal curable release film whose stickiness is decreased by a thermal-curing process, and the first dielectric layer DI may be made of other photosensitive or non-photosensitive dielectric materials. After the carrier C having the de-bonding layer DB and the dielectric layer DI formed thereon is provided, a plurality of conductive through vias TIV are formed on the dielectric layer DI. In some embodiments, the plurality of conductive through vias TIV is formed by photoresist coating, photolithography, plating, and photoresist stripping process. For example, the conductive through vias TIV include copper posts or other suitable metallic posts.

Figure 7:
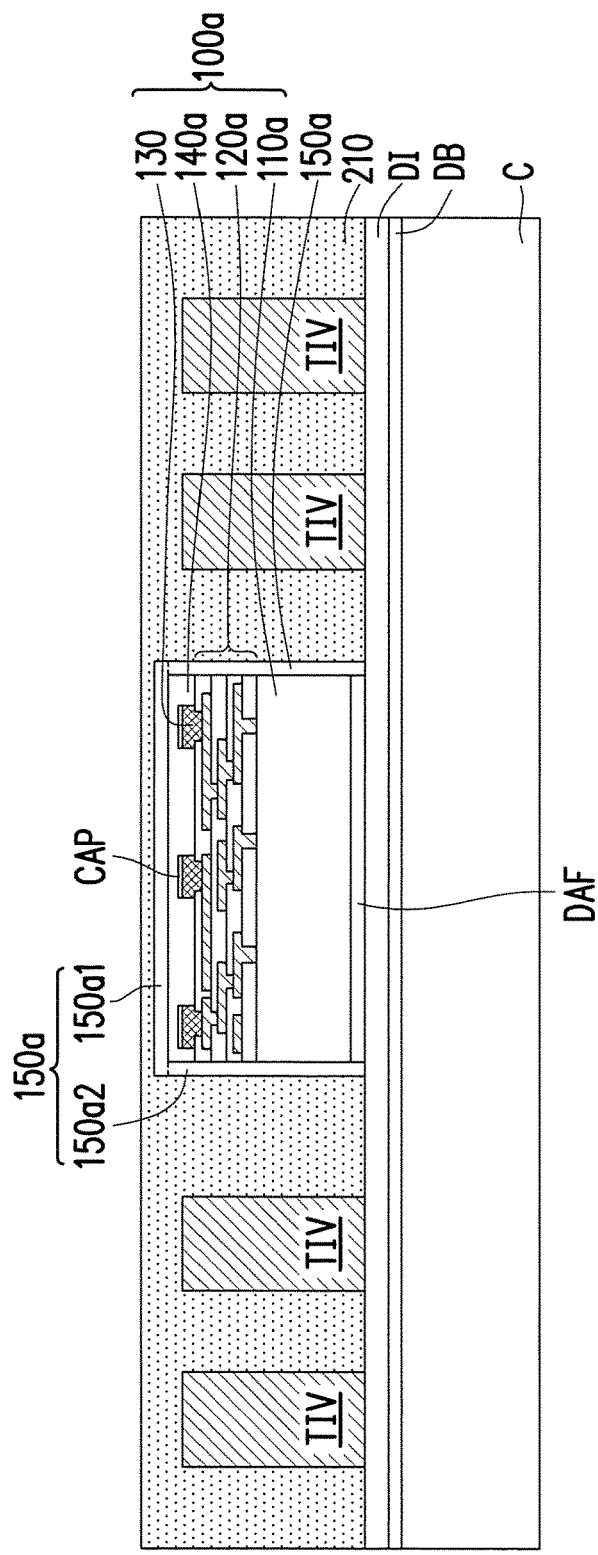

Referring to FIG. 5 and FIG. 7, when de-bonding the semiconductor dies 100a and the die attachment films DAF from the tray TR (shown in FIG. 5), a plurality of conductive layers 150a (shown in FIG. 7) covering the top surface and the sidewalls of the semiconductor die 100a are automatically formed. Each one of the conductive layers 150 respectively includes a cap layer 150a1 and an electromagnetic interference shielding layer 150a2 connected to the cap layer 150a1. The cap layers 150a1 of the conductive layers 150a cover the top surfaces of the semiconductor dies 100a and the electromagnetic interference shielding layers 150a2 of the conductive layers 150a cover the sidewalls of the semiconductor dies 100a. As shown in FIG. 7, at least one of the singulated semiconductor die 100a covered by the conductive layer 150a is picked and placed on the dielectric layer DI. The semiconductor die 100a is attached or adhered on the dielectric layer DI through the die attachment film DAF.

In some alternative embodiments, two or more semiconductor dies 100a having the conductive layers 150a covered thereon may be cut from the same wafer W and placed on the dielectric layer DI. The semiconductor dies 100a placed on the dielectric layer DI may be arranged in an array. In such embodiments, the semiconductor dies 100a placed on the dielectric layer DI are arranged in an array, the conductive through vias TIV may be arranged around the semiconductor dies 100a.

Referring to FIG. 7, the semiconductor die 100a having the conductive layers 150a covered thereon is picked and placed on the dielectric layer DI after the formation of the conductive through vias TIV. However, the disclosure is not limited thereto. In some alternative embodiments, the semiconductor die 100a having the conductive layers 150a covered thereon is picked and placed on the dielectric layer DI before the fonnation of the conductive through vias TIV.

As shown in FIG. 7, an insulating material 210 is formed on the dielectric layer DI to cover the semiconductor die 100a, the conductive layers 150a and the conductive through vias TIV. In some embodiments, the insulating material 210 is a molding compound formed by an overmolding process (e.g., a compression molding process). The conductive pillars 130 and the protection cap 140a of the semiconductor die 100a are not revealed and are protected by the insulating material 210. In some embodiments, the material of the insulating material 210 includes epoxy resin or other suitable dielectric materials.

Figure 8:
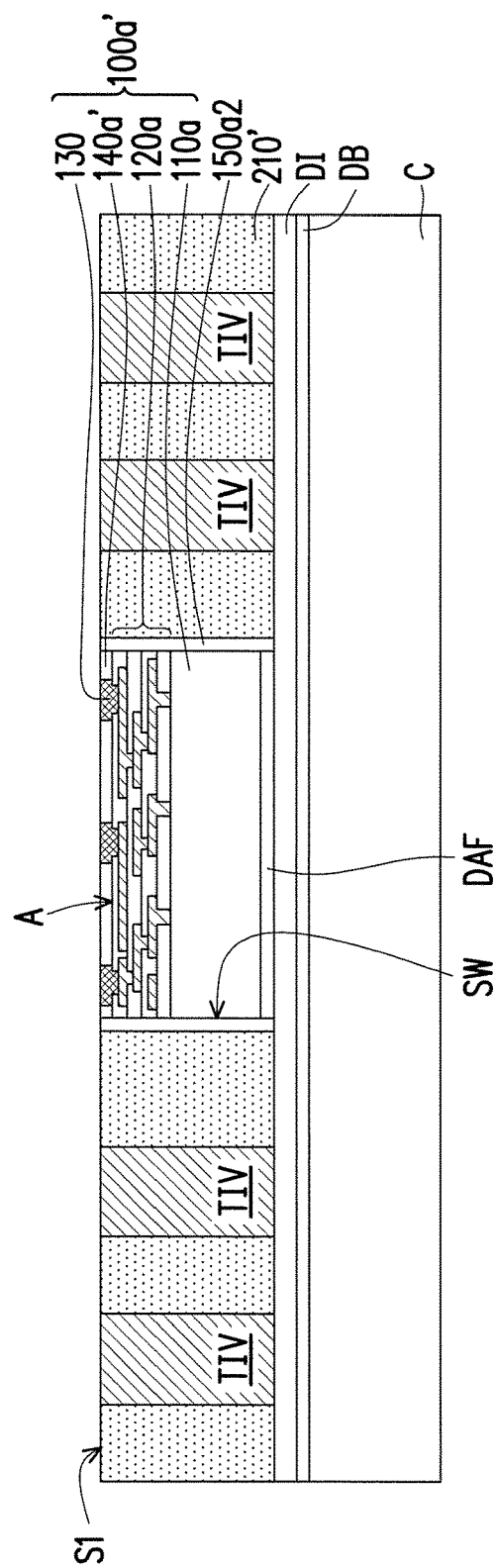

Referring to FIG. 7 and FIG. 8, the insulating material 210, the conductive layer 150a and the protection cap 140a are partially grinded so as to remove the cap layer 150a1 of the conductive layer 150a until top surfaces of the conductive pillars 130 are exposed such that an integrated circuit component 100a' and an insulating encapsulation 210' are formed, wherein the insulating encapsulation 210' encapsulates the integrated circuit component 100a' and the electromagnetic interference shielding layer 150a2 that covers sidewalls of the integrated circuit component 100a'. In other words, the electromagnetic interference shielding layer 150a2 remains after the above-mentioned grinding process is performed. In some embodiments, the insulating material 210 is grinded by a mechanical grinding process and/or a chemical mechanical polishing (CMP) process. During the grinding process of the insulating material 210, parts of the protection cap 140a, the conductive caps CAP, and parts of the conductive pillars 130 are grinded until the top surfaces of the conductive pillars 130 are exposed. After the grinding process of the insulating material 210 is performed, a grinded protection cap 140a' is formed. In some embodiments, during the grinding process of the insulating material 210, parts of the conductive through vias TIV are grinded also.

As shown in FIG. 8, the integrated circuit component 100a' includes an active surface A, a plurality of sidewalls SW connected to the active surface A and a plurality of conductive pillars 130 protruding from the active surface A. The electromagnetic interference shielding layer 150a2 is electrically grounded and covers the sidewalls SW of the integrated circuit component 100a'. The insulating encapsulation 210' encapsulates the integrated circuit component 100a' and the electromagnetic interference shielding layer 150a2. Furthermore, the conductive pillars 130 are accessibly exposed by the insulating encapsulation 210'. In some embodiments, the integrated circuit component 100a' and the insulating encapsulation 210' are spaced apart by the electromagnetic interference shielding layer 150a2 and the integrated circuit component 100a' is surrounded by the electromagnetic interference shielding layer 150a2.

As shown in FIG. 8, the insulating encapsulation 210' is penetrated by the conductive through vias TIV. In other words, the integrated circuit component 100a' and the conductive through vias TIV are embedded in the insulating encapsulation 210'. It is noted that the top surfaces of the conductive through vias TIV, a first surface S1 (i.e. top surface) of the insulating encapsulation 210', and the top surfaces of the conductive pillars 130 are substantially coplanar with the top surface of the protection cap 140a'.

Figure 9:
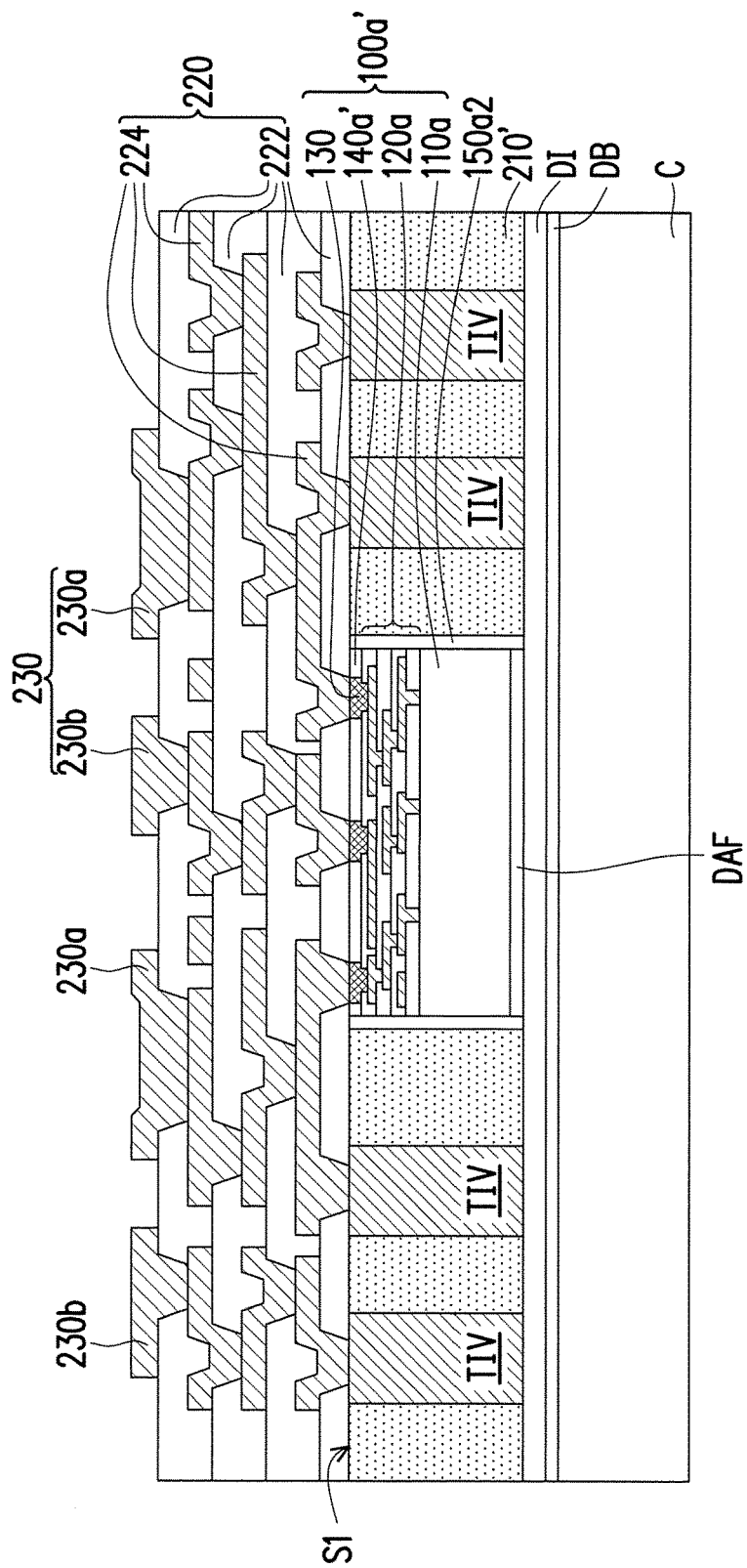

Referring to FIG. 9, after forming the integrated circuit component 100a', the electromagnetic interference shielding layer 150a2, the insulating encapsulation 210' and the protection cap 140a', a first redistribution circuit structure 220 electrically connected to the conductive pillars 130 of the integrated circuit component 100a' is formed on the top surfaces of the conductive through vias TIV, a first surface S1 (i.e. the top surface) of the insulating encapsulation 210', the top surfaces of the conductive pillars 130 and the top surface of the protection cap 140a'. Since the first redistribution circuit structure 220 is fabricated over the integrated circuit component 100a' and the insulating encapsulation 210', the first redistribution circuit structure 220 (i.e. a first redistribution circuit structure) is a so-called front side redistribution circuit structure.

As shown in FIG. 9, the first redistribution circuit structure 220 includes a plurality of dielectric layers 222 and a plurality of redistribution conductive layers 224 stacked alternately. In some embodiments, top surfaces of the conductive pillars 130 and top surfaces of the conductive through vias TIV are in contact with the first redistribution circuit structure 220. The top surfaces of the conductive pillars 130 and the top surfaces of the conductive through vias TIV are partially covered by the bottommost dielectric layer 222.

Referring to FIG. 9, after the first redistribution circuit structure 220 is formed, a plurality of pads 230 are then formed on the topmost redistribution conductive layer 224 of the first redistribution circuit structure 220. The pads 230 include a plurality of under-ball metallurgy (UBM) patterns 230a for ball mount and a plurality of connection pads 230b for mounting of passive components. The pads 230 are electrically connected to the topmost redistribution conductive layer 224 of the first redistribution circuit structure 220. In other words, the pads 230 are electrically connected to the conductive pillars 130 of the integrated circuit component 100a' and the conductive through vias TIV through the first redistribution circuit structure 220. It is noted that the number of the UBM patterns 230a and the connection pads 230b is not limited in this disclosure.

Figure 10:
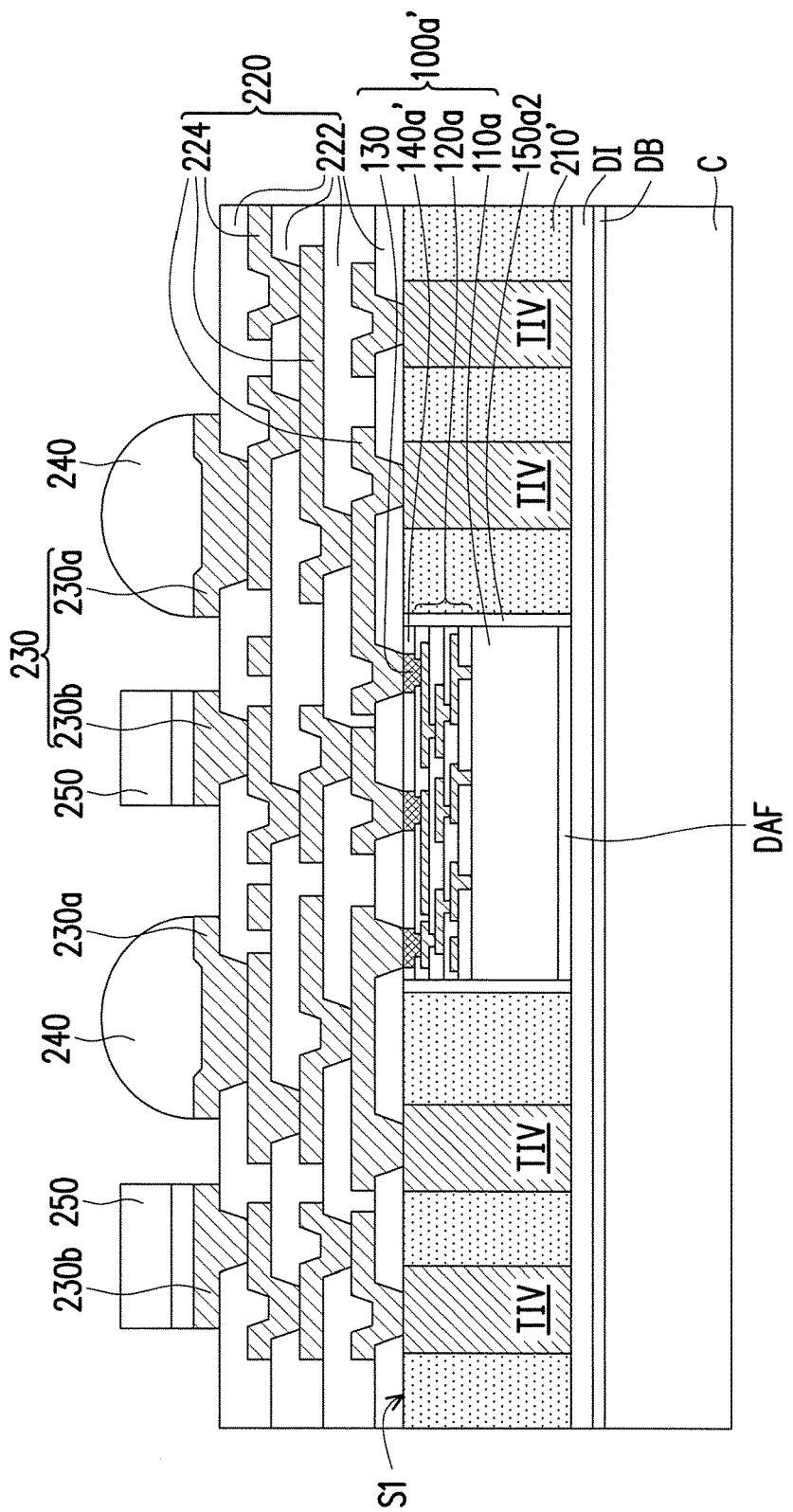

Referring to FIG. 10, after the UBM patterns 230a and the connection pads 230b are formed, a plurality of conductive balls 240 are placed on the under-ball metallurgy patterns 230a, and a plurality of passive components 250 are mounted on the connection pads 230b. In some embodiments, the conductive balls 240 may be placed on the under-ball metallurgy patterns 230a by a ball placement process and the passive components 250 may be mounted on the connection pads 230b through a soldering or reflowing process. In some embodiments, the height of the conductive balls 240 is greater than the height of the passive components 250, for example.

Figure 11:
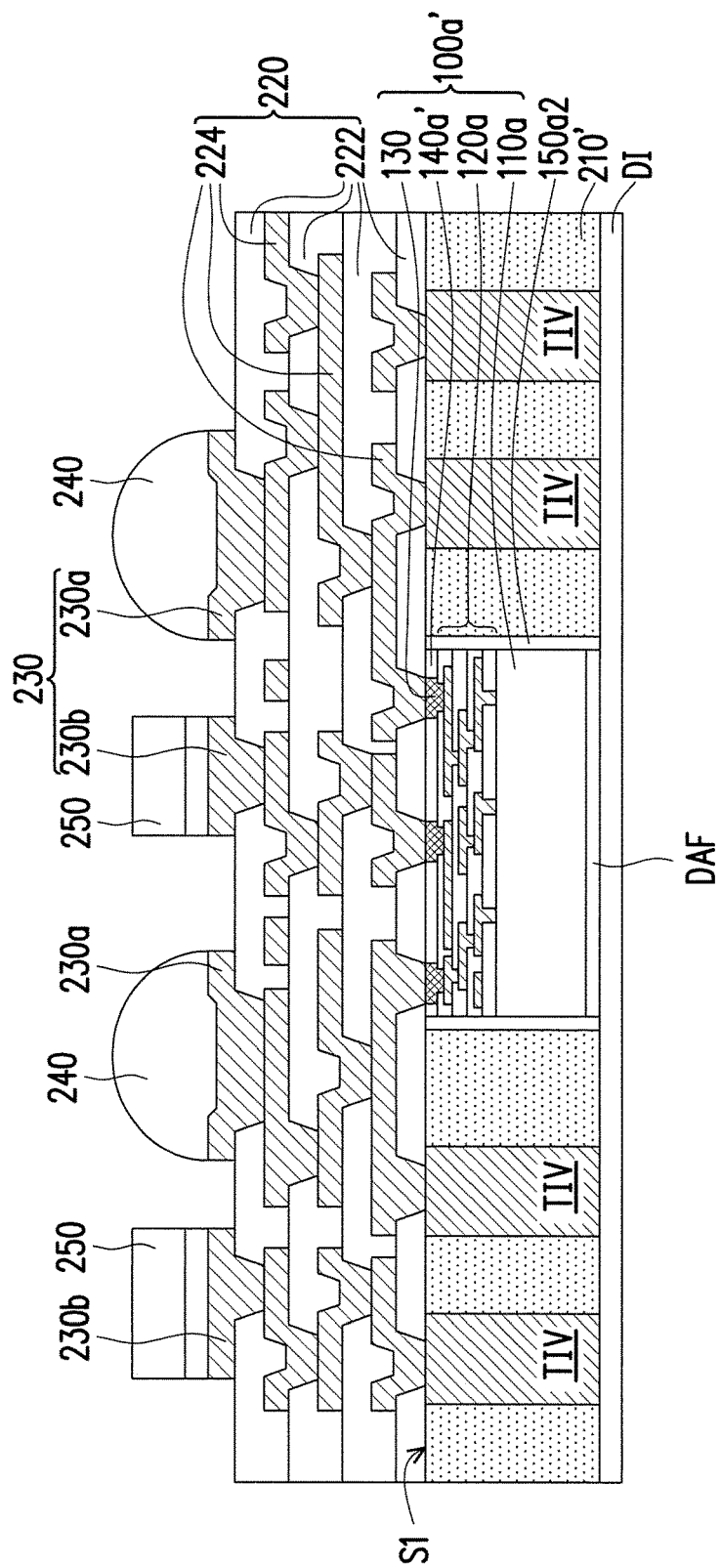

Referring to FIG. 10 and FIG. 11, after the conductive balls 240 and the passive components 250 are mounted on the pads 230, the dielectric layer DI formed on the bottom surface of the insulating encapsulation 210' is de-bonded from the de-bonding layer DB such the dielectric layer DI is separated from the carrier C. In some embodiments, the de-bonding layer DB (e.g., the LTHC release layer) may be irradiated by an UV laser such that the dielectric layer DI is peeled from the carrier C.

Figure 12:
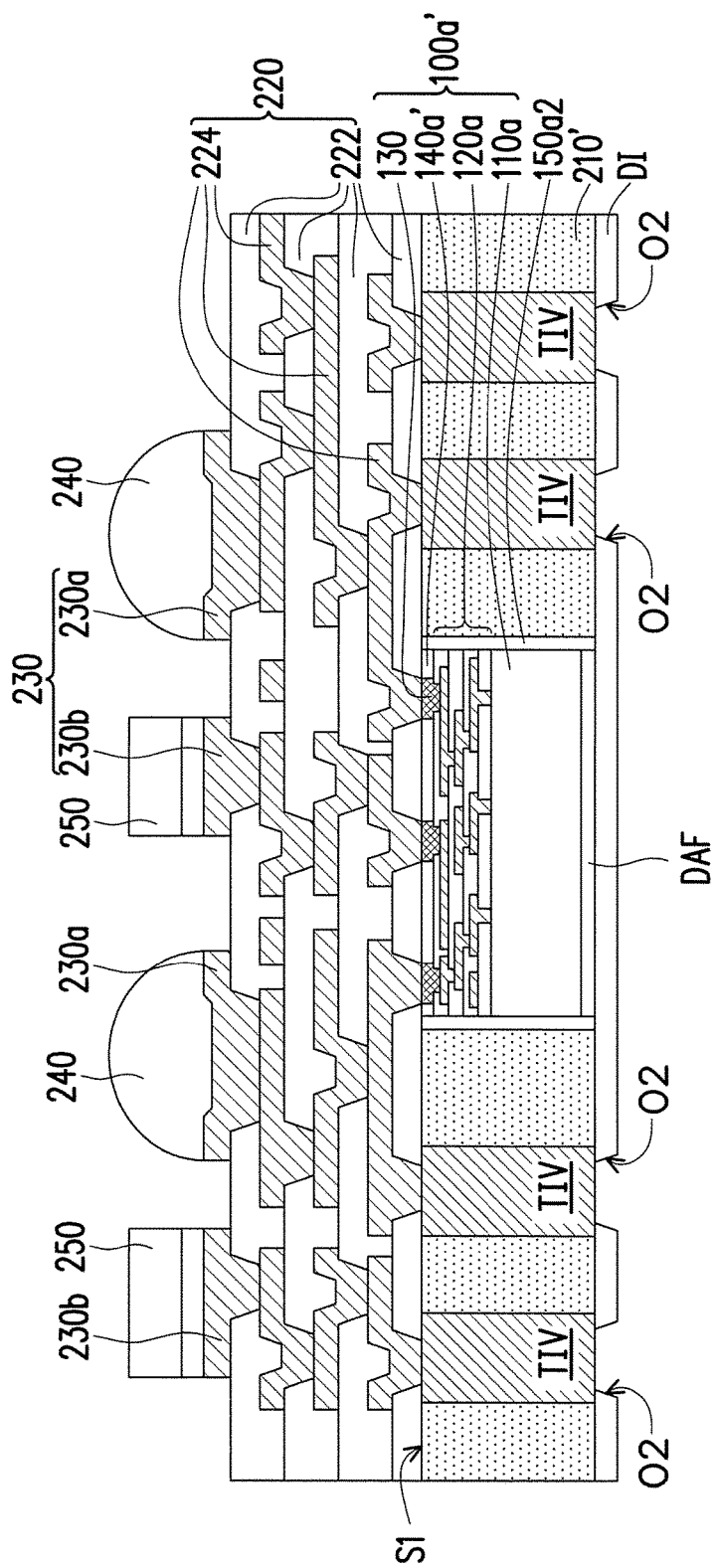

As shown in FIG. 12, the dielectric layer DI is then patterned such that a plurality of contact openings O2 are formed to expose the bottom surfaces of the conductive through vias TIV. The number and position of the contact openings O2 are corresponding to the number of the conductive through vias TIV. In some embodiments, the contact openings O2 of the dielectric layer DI are formed by a laser drilling process or other suitable patterning processes. In some alternative embodiments, the dielectric layer DI may be entirely removed from the bottom surface of the insulating encapsulation 210' so as to expose the bottom surfaces of the conductive through vias TIV.

Figure 13:
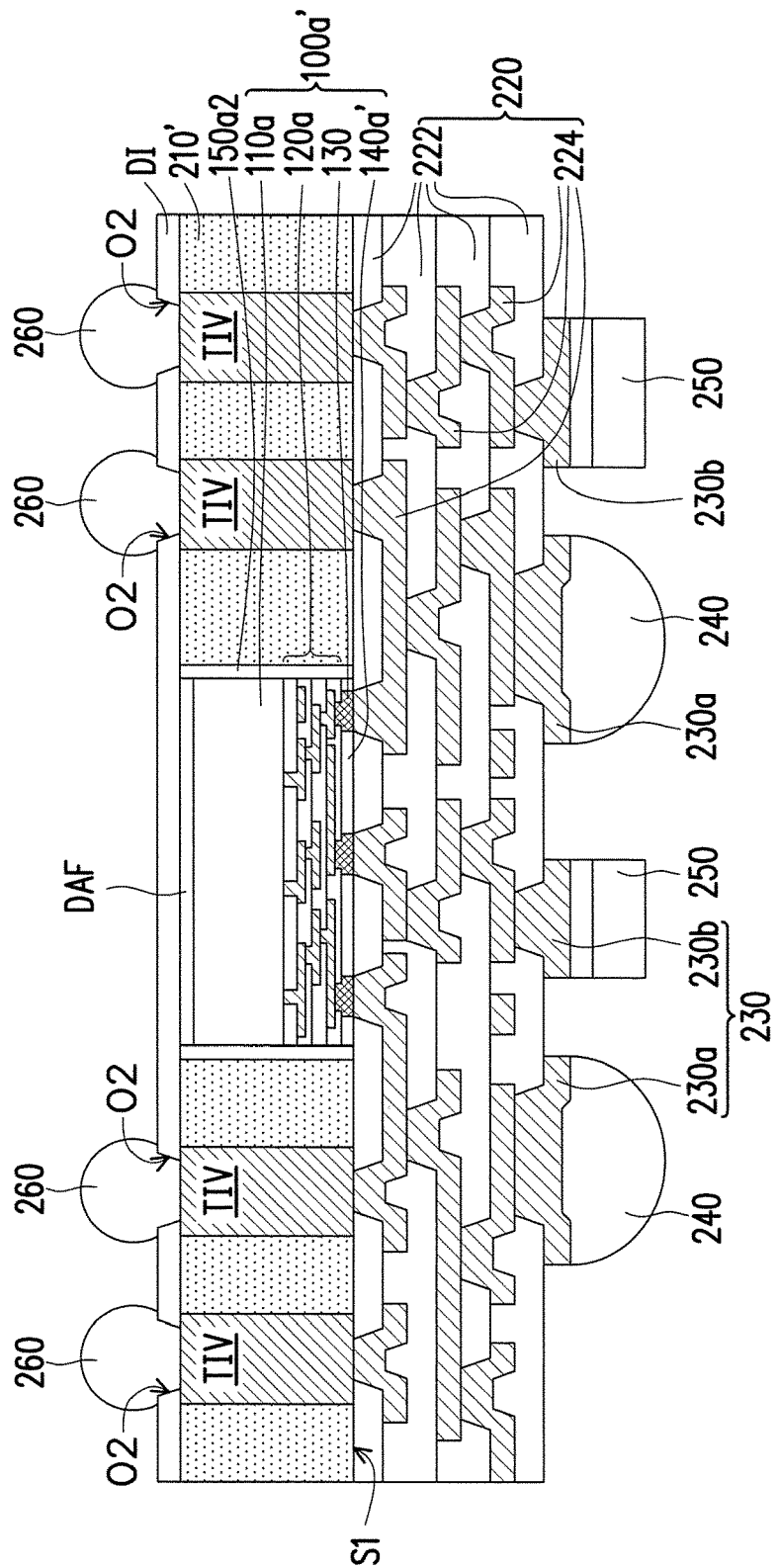

Referring to FIG. 13, after the contact openings O2 are formed in the dielectric layer DI, a plurality of conductive balls 260 are placed on the bottom surfaces of the conductive through vias TIV that are exposed by the contact openings O2. And, the conductive balls 260 are, for example, reflowed to bond with the bottom surfaces of the conductive through vias TIV. As shown in FIG. 13, after the conductive balls 230 and the conductive balls 260 are formed, an integrated fan-out package of the integrated circuit component 100a' having dual-side terminal design (i.e. the conductive balls 240 and 260) is accomplished.

Figure 14:
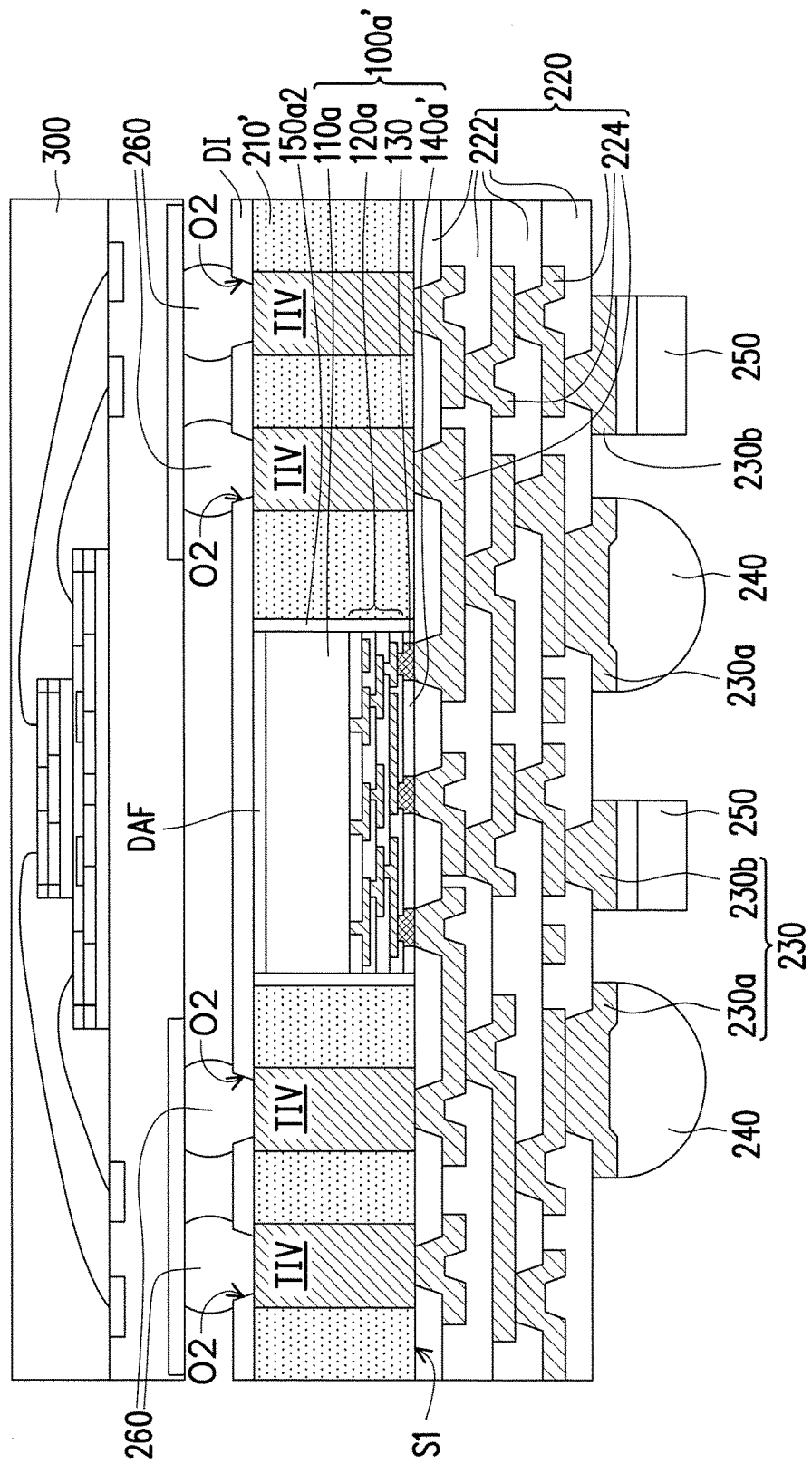
FIG. 14 is a cross-sectional view illustrating a package-on-package (POP) structure in accordance with some embodiments of the present disclosure.

FIG. 14 is a cross-sectional view illustrating a package-on-package (POP) structure in accordance with some embodiments of the present disclosure. Referring to FIG. 14, a semiconductor device 300 is then provided. The semiconductor device 300 is, for example, a memory device or other suitable semiconductor dies. The semiconductor device 300 is stacked over and is electrically connected to the integrated fan-out package illustrated in FIG. 13 through the conductive balls 260 such that a package-on-package (POP) structure is fabricated.

Figure 26:
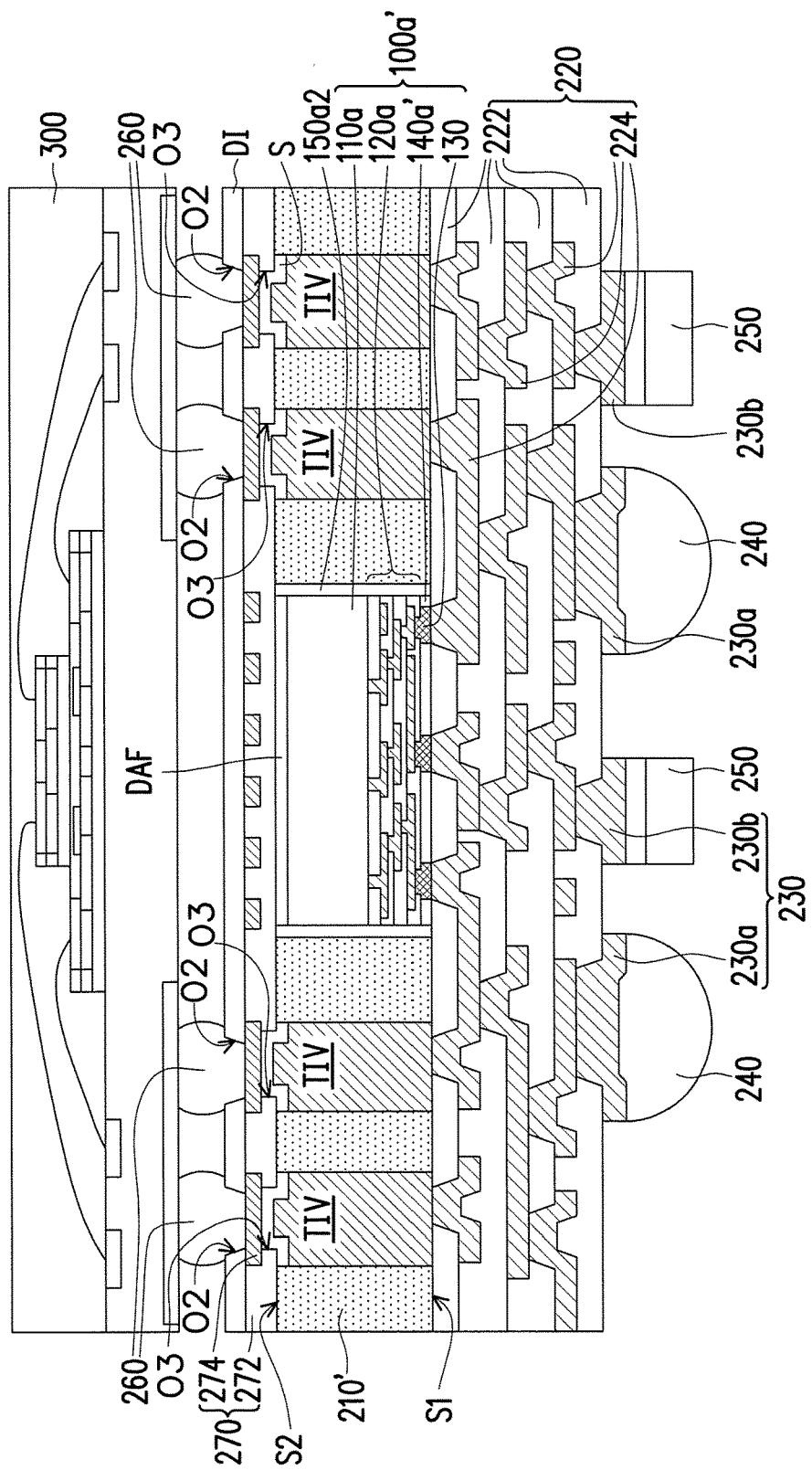
FIG. 26 is a cross-sectional view illustrating a package-on-package (POP) structure in accordance with some alternative embodiments of the present disclosure.

FIG. 15 through FIG. 25 schematically illustrate a process flow for fabricating an integrated fan-out package in accordance with some alternative embodiments of the present disclosure; and FIG. 26 is a cross-sectional view illustrating a package-on-package (POP) structure in accordance with some alternative embodiments of the present disclosure.

Referring to FIG. 15, a carrier C having a de-bonding layer DB and a dielectric layer DI formed thereon is provided, wherein the de-bonding layer DB is between the carrier C and the dielectric layer DI. In some embodiments, the carrier C is a glass substrate, the de-bonding layer DB is a light-to-heat conversion (LTHC) release layer formed on the glass substrate, and the dielectric layer DI is a polybenzoxazole (PBO) layer formed on the de-bonding layer DB, for example. In alternative embodiments, the de-bonding layer DB may be a photo-curable release film whose stickiness is decreased by a photo-curing process or a thermal curable release film whose stickiness is decreased by a thermal-curing process, and the first dielectric layer DI may be made of other photosensitive or non-photosensitive dielectric materials. After the carrier C having the de-bonding layer DB and the dielectric layer DI formed thereon is provided, a second redistribution circuit structure 270 (i.e. a back side redistribution circuit structure) is formed on the carrier C. The second redistribution circuit structure 270 includes at least one dielectric layer 272 and at least one redistribution conductive layer 274. The at least one dielectric layer 272 covers the at least one redistribution conductive layer 274, and the at least one dielectric layer 272 includes a plurality of opening O3 for exposing the redistribution conductive layer 274 underneath.

Referring to FIG. 16, after the second redistribution circuit structure 270 is formed on the carrier C, a seed layer S is formed on the second redistribution circuit structure 270. In some embodiments, the seed layer S may be a sputtered Ti/Cu seed layer formed on the second redistribution circuit structure 270. As shown in FIG. 16, a patterned photoresist PR including a plurality of openings O4 is formed on the seed layer S. The position and the number of the openings O4 in the patterned photoresist PR are corresponding to the openings O3 of the dielectric layer 272. Furthermore, the seed layer S is partially exposed by the openings O4 in the patterned photoresist PR.

Figure 17:
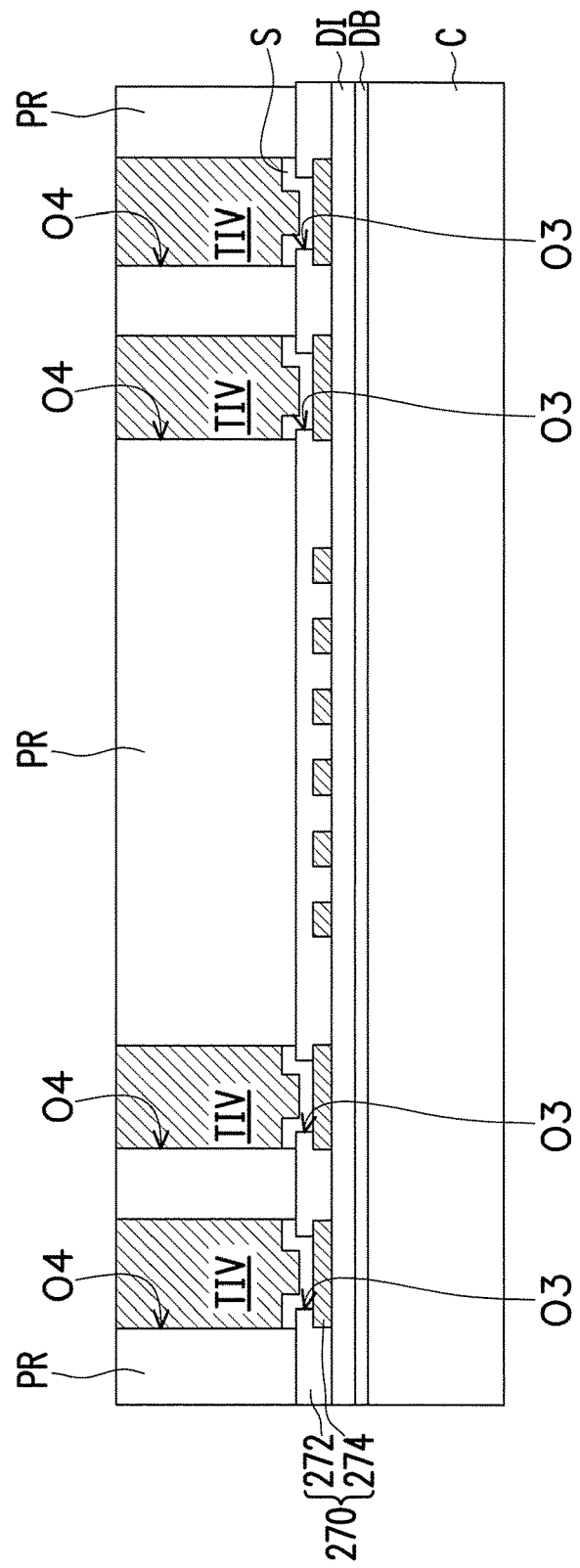

Referring to FIG. 17, the carrier C having second redistribution circuit structure 270, the seed layer S and the patterned photoresist PR thereon is immersed into a plating bath such that a plurality of conductive through vias TIV are formed in the openings O4. The conductive through vias TIV partially covers on the seed layer S.

Figure 18:
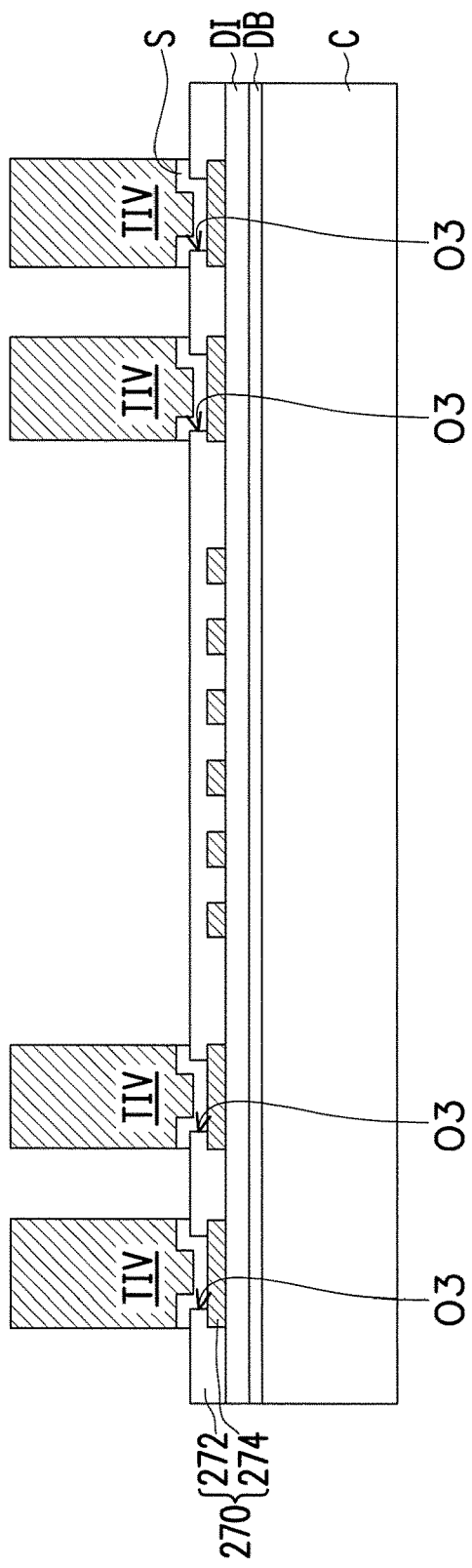
Figure 19:
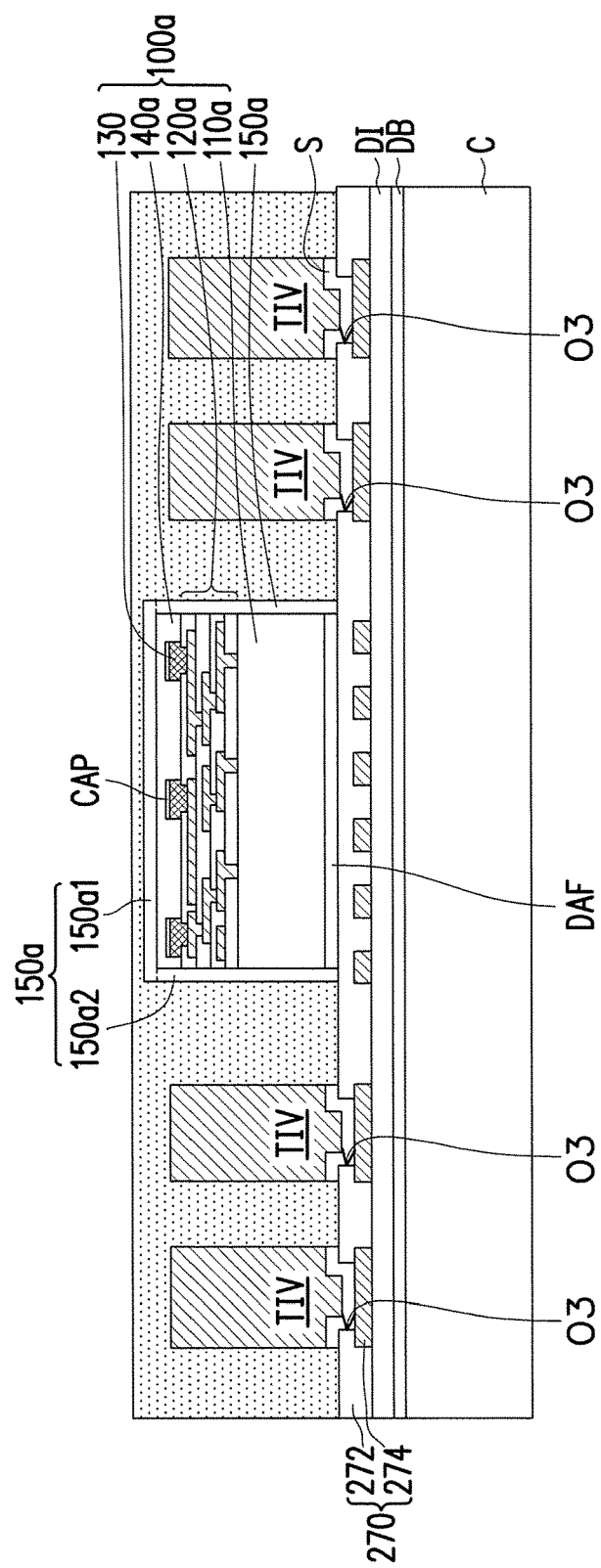
Figure 20:
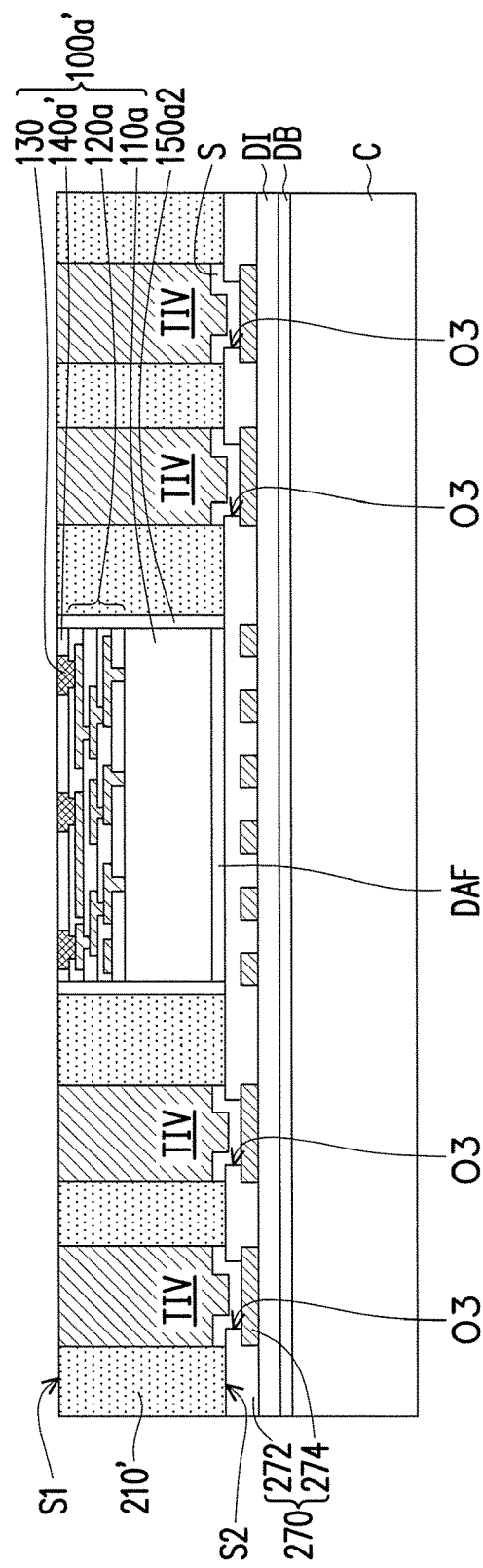
Figure 21:
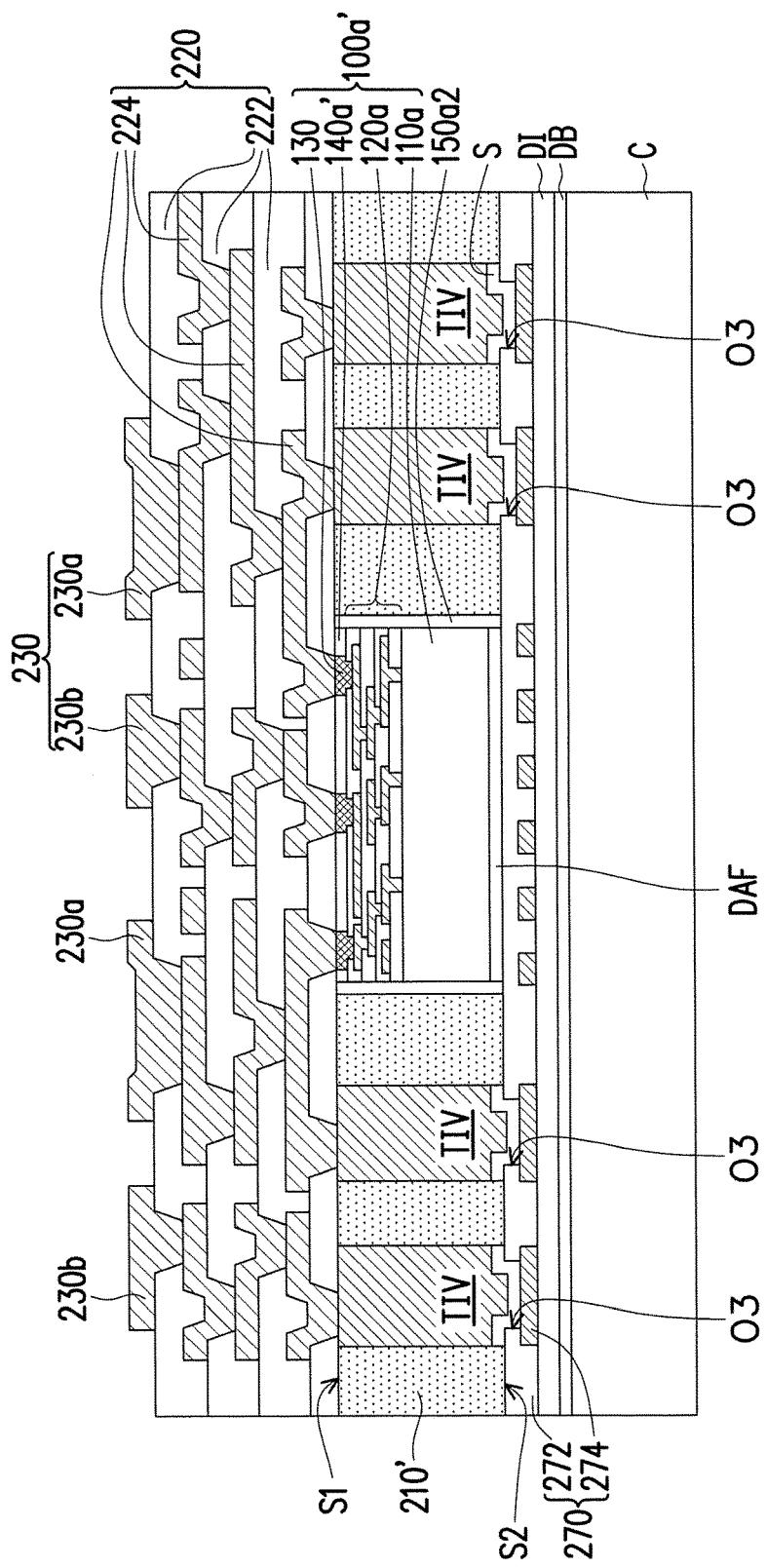
Figure 22:
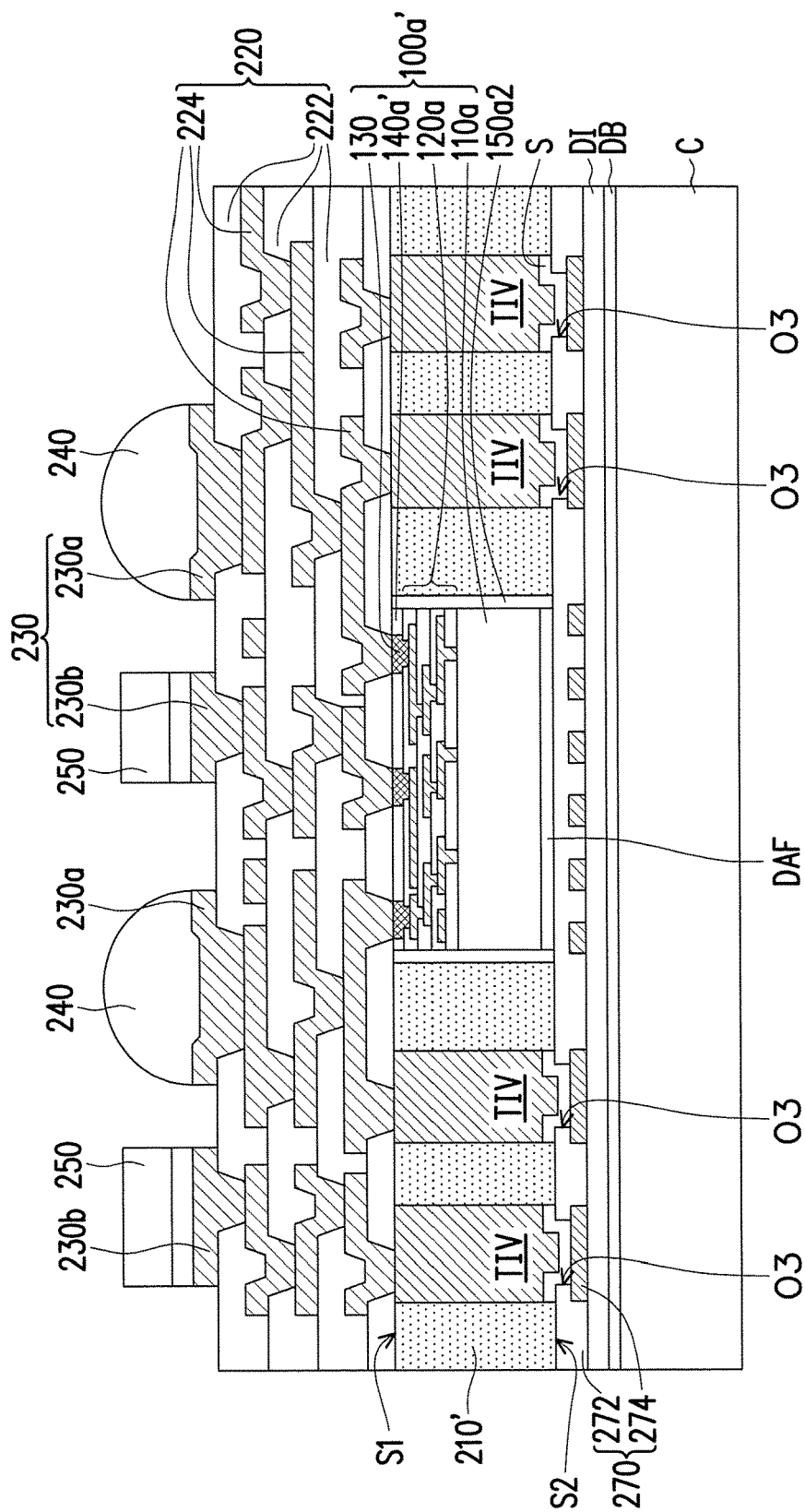
Figure 23:
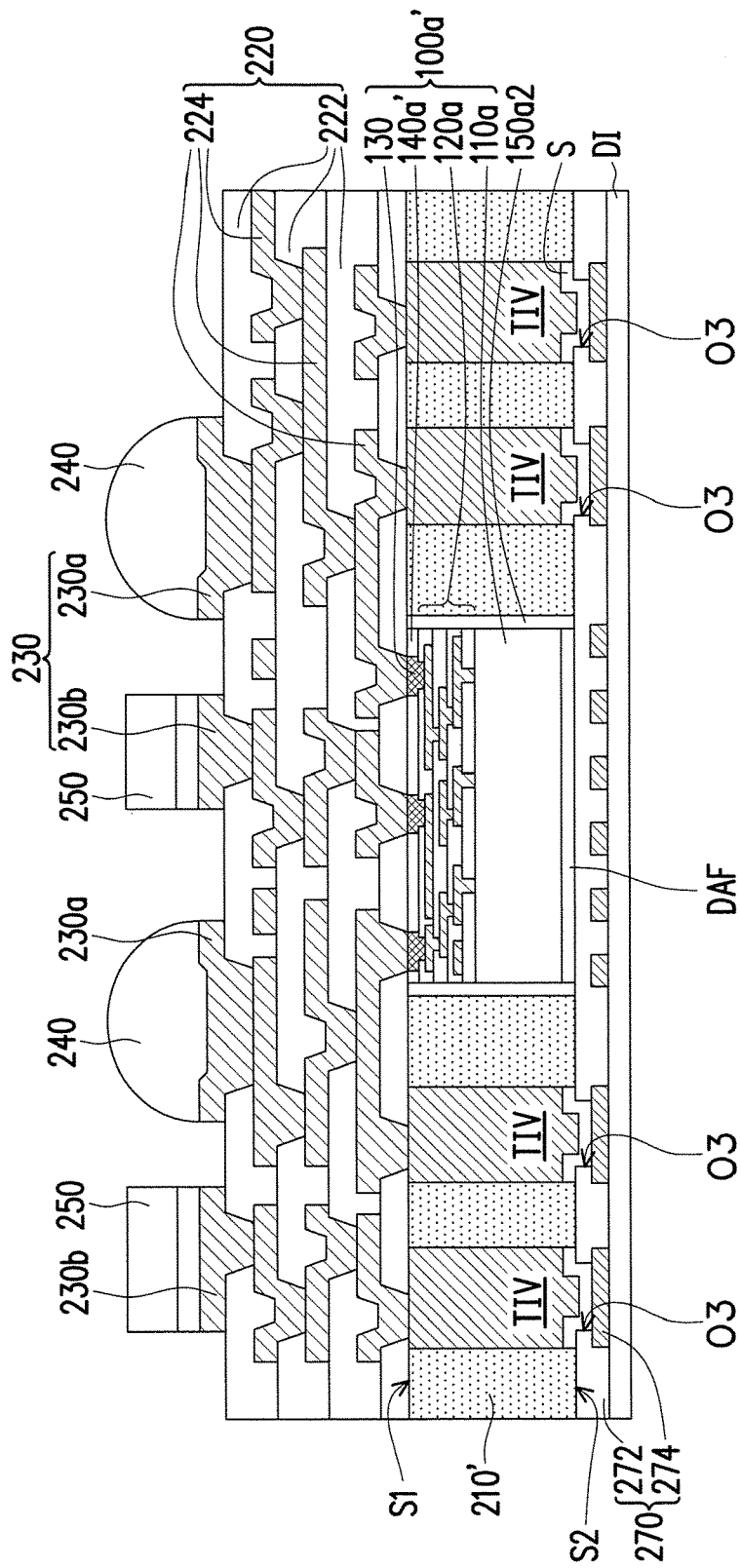
Figure 24:
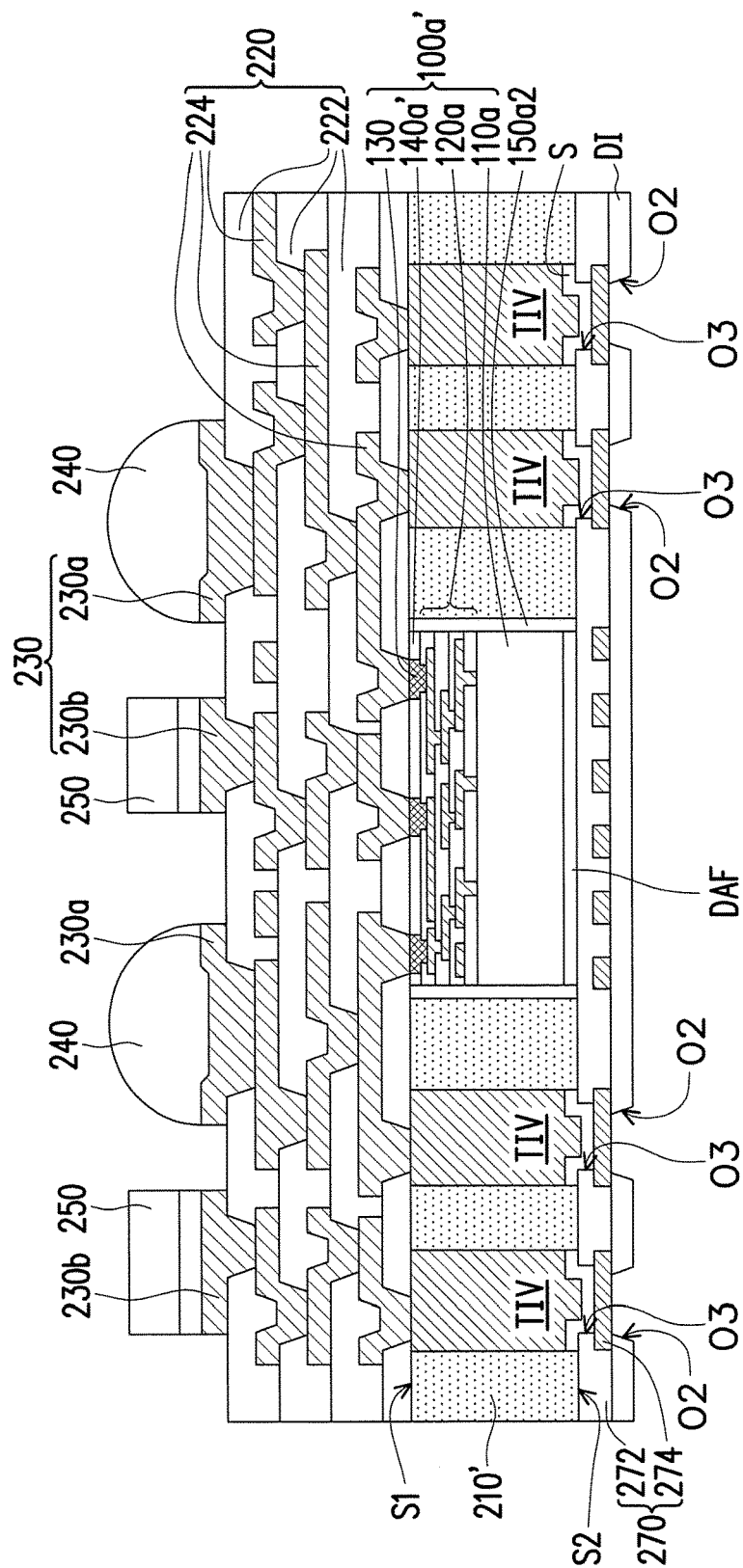
Figure 25:
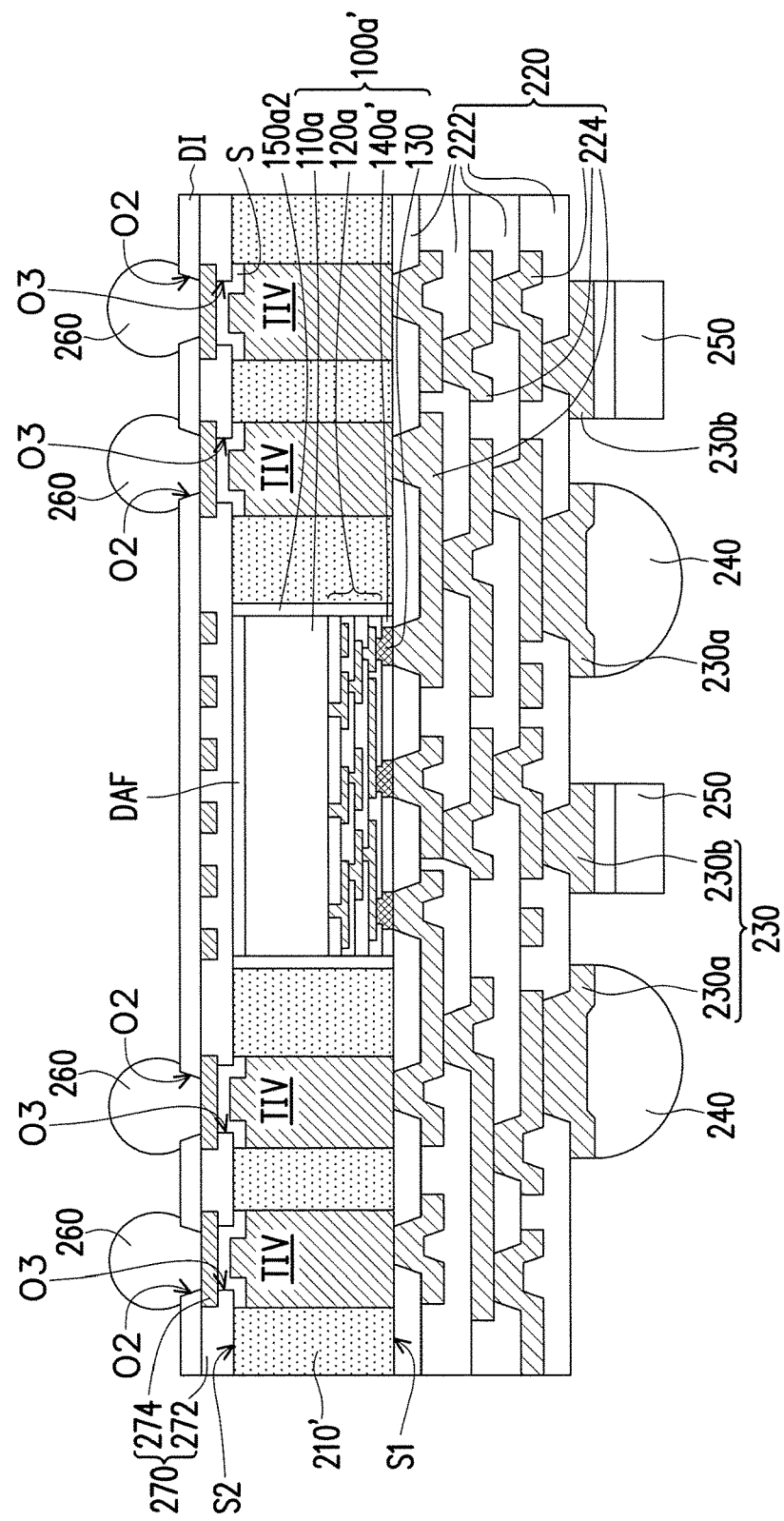

Referring to FIG. 18, after the conductive through vias TIV are formed onto the exposed seed layer S through plating, the patterned photoresist PR is removed. Thereafter, the seed layer S is patterned by using the conductive through vias TIV as a hard mask. In some embodiments, the conductive through vias TIV may be copper posts or other suitable metallic posts.

Referring to FIG. 19 through FIG. 25, the process flow for fabricating an integrated fan-out package is similar with that illustrated in FIG. 7 through FIG. 13 except that the second redistribution circuit structure 270 is formed before the formation of the insulating material 210 and the insulating encapsulation 210', the second redistribution circuit structure 270 is disposed on a second surface S2 (i.e. a bottom surface) that is opposite to the first surface S1 (shown in FIG. 20), and the first redistribution circuit structure 220 is electrically connected to the second redistribution circuit structure 270 through the through insulator vias TIV. In other words, the integrated circuit components 100a' is electrically connected to the second redistribution circuit structure 270 through the first redistribution circuit structure 220 and the through insulator vias TIV. The detailed descriptions of FIG. 19 through FIG. 25 are thus omitted.

Referring to FIG. 26, the process flow for fabricating a package-on-package (POP) structure is similar with that illustrated in FIG. 14 through FIG. 13 except that the semiconductor device 300 is disposed on the second redistribution circuit structure 270, wherein the semiconductor device 300 is electrically connected to the integrated circuit component 100a' through the second redistribution circuit structure 270, the conductive through vias TIV and the first redistribution circuit structure 220.

FIG. 27 through FIG. 33 schematically illustrate a process flow for fabricating an integrated fan-out package in accordance with yet some alternative embodiments of the present disclosure.

Figure 27:
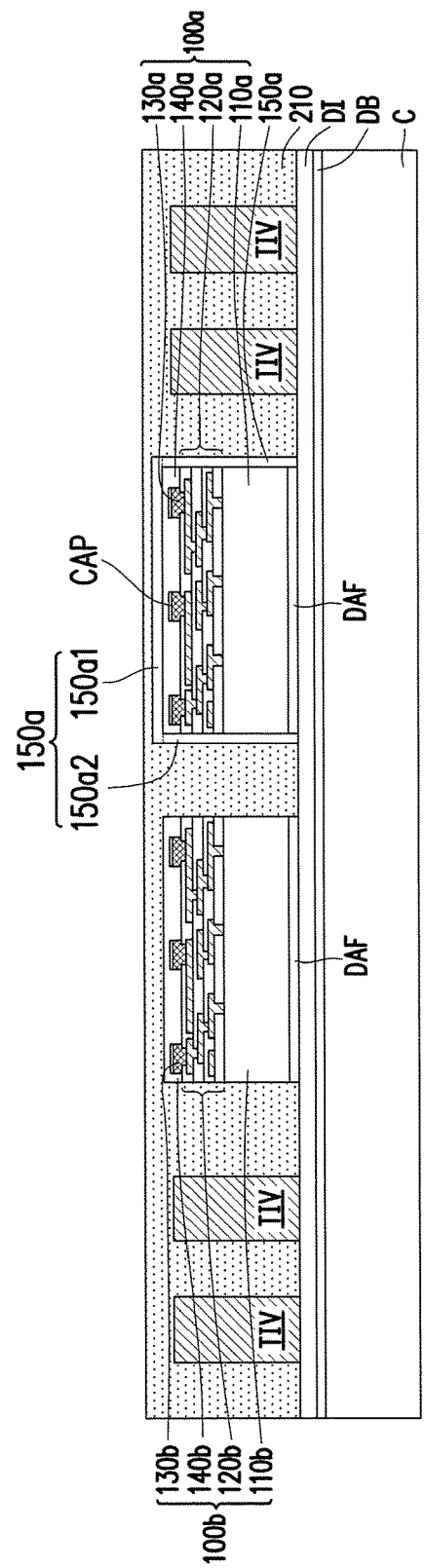
FIG. 27 through FIG. 33 schematically illustrate a process flow for fabricating an integrated fan-out package in accordance with yet some alternative embodiments of the present disclosure.

Referring to FIG. 27, a carrier C having a de-bonding layer DB and a dielectric layer DI formed thereon is provided, wherein the de-bonding layer DB is between the carrier C and the dielectric layer DI. In some embodiments, the carrier C is a glass substrate, the de-bonding layer DB is a light-to-heat conversion (LTHC) release layer formed on the glass substrate, and the dielectric layer DI is a polybenzoxazole (PBO) layer formed on the de-bonding layer DB, for example. In alternative embodiments, the de-bonding layer DB may be a photo-curable release film whose stickiness is decreased by a photo-curing process or a thermal curable release film whose stickiness is decreased by a thermal-curing process, and the first dielectric layer DI may be made of other photosensitive or non-photosensitive dielectric materials. After the carrier C having the de-bonding layer DB and the dielectric layer DI formed thereon is provided, a plurality of conductive through vias TIV are formed on the dielectric layer DI. In some embodiments, the plurality of conductive through vias TIV is formed by photoresist coating, photolithography, plating, and photoresist stripping process. For example, the conductive through vias TIV include copper posts or other suitable metallic posts.

As shown in FIG. 27, at least one first semiconductor die 100a covered by the conductive layer 150a and at least one second semiconductor die 100b are provided and on the dielectric layer DI carried by the carrier C. In some embodiments, the first semiconductor die 100a which is covered by the conductive layer 150a is picked-up from the tray TR (shown in FIG. 5). The first semiconductor die 100a which is covered by the conductive layer 150a may have the same structure as that of the semiconductor dies 100a illustrated in FIG. 7. The second semiconductor die 100b which is not covered by the conductive layer 150a may have the same structure as that of the semiconductor dies 100a illustrated in FIG. 4. In some embodiments, the first semiconductor die 100a covered by the conductive layer 150a and the second semiconductor die 100b which is not covered by the conductive layer 150a may be cut from the same wafer W (shown in FIG. 4). In some alternative embodiments, the first semiconductor die 100a covered by the conductive layer 150a and the second semiconductor die 100b which is not covered by the conductive layer 150a may be cut from different wafers.

The first semiconductor die 100a includes a first semiconductor substrate 110a, a first interconnection structure 120a disposed on the first semiconductor substrate 110a, a plurality of first conductive pillars 130 and a first protection cap 140a. The first protection cap 140a encapsulates the first conductive pillars 130a and covers the first interconnection structure 120a. The second semiconductor die 100b includes a second semiconductor substrate 110b, a second interconnection structure 120b disposed on the second semiconductor substrate 110b, a plurality of second conductive pillars 130b and a second protection cap 140b. The second protection cap 140b encapsulates the second conductive pillars 130b and covers the second interconnection structure 120b.

Referring to FIG. 27, the first semiconductor die 100a and the second semiconductor die 100b are picked and placed on the dielectric layer DI after the formation of the conductive through vias TIV. However, the disclosure is not limited thereto. In some alternative embodiments, the first semiconductor die 100a and the second semiconductor die 100b are picked and placed on the dielectric layer DI before the formation of the conductive through vias TIV.

As shown in FIG. 27, an insulating material 210 is formed on the dielectric layer DI to cover the first semiconductor die 100a, the second semiconductor die 100b, the conductive layer 150a, and the conductive through vias TIV. In some embodiments, the insulating material 210 is a molding compound formed by an over-molding process (e.g., a compression molding process). The conductive pillars 130, the first protection cap 140a of the first semiconductor die 100a and the second protection cap 140b of the second semiconductor die 100b are not revealed and are protected by the insulating material 210. In some embodiments, the material of the insulating material 210 includes epoxy resin or other suitable dielectric materials.

Figure 28:
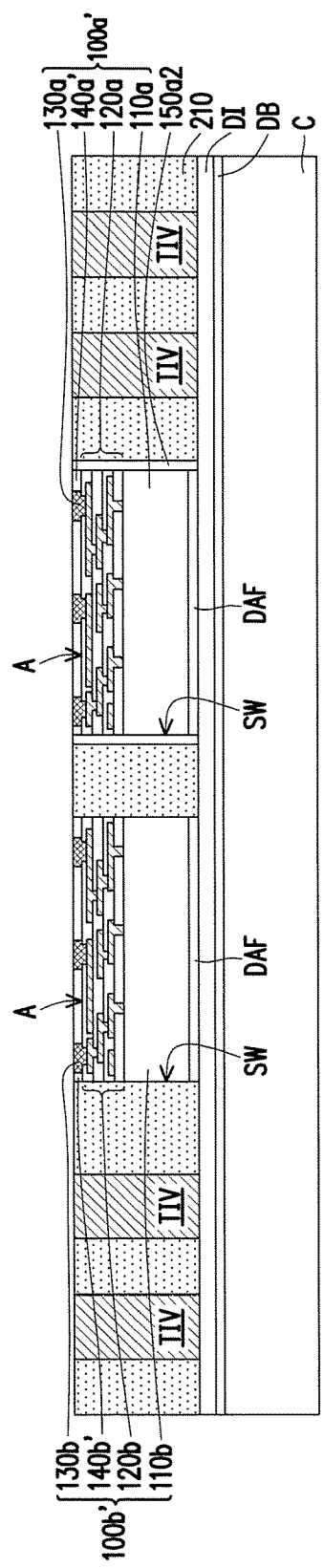

Referring to FIG. 27 and FIG. 28, the insulating material 210, the conductive layer 150a, the first protection cap 140a, the second protection cap 140b are partially grinded so as to remove the cap layer 150a1 of the conductive layer 150a until top surfaces of the first conductive pillars 130a and the second conductive pillars 130b are exposed such that a first integrated circuit component 100a', a second integrated circuit component 100b' and an insulating encapsulation 210' are formed, wherein the insulating encapsulation 210' encapsulates the first integrated circuit component 100a', the second integrated circuit component 100b' and the electromagnetic interference shielding layer 150a2 that covers sidewalls of the first integrated circuit component 100a'. In other words, the electromagnetic interference shielding layer 150a2 remains after the above-mentioned grinding process is performed. In some embodiments, the insulating material 210 is grinded by a mechanical grinding process and/or a chemical mechanical polishing (CMP) process. During the grinding process of the insulating material 210, parts of the first protection cap 140a, parts of the second protection cap 140b, the conductive caps CAP, parts of the first conductive pillars 130a, and parts of the second conductive pillars 130b are grinded until the top surfaces of the first conductive pillars 130a and the second conductive pillars 130b are exposed. After the grinding process of the insulating material 210 is performed, a first protection caps 140a' and a second protection caps 140b' are formed. In some embodiments, during the grinding process of the insulating material 210, parts of the conductive through vias TIV are grinded also.

As shown in FIG. 28, the first integrated circuit component 100a' includes an active surface A, a plurality of sidewalls SW connected to the active surface A and a plurality of conductive pillars 130 protruding from the active surface A. The electromagnetic interference shielding layer 150a2 is electrically grounded and covers the sidewalls SW of the integrated circuit component 100a'. The second integrated circuit component 100b' has similar structure as the first integrated circuit component 100a'. The insulating encapsulation 210' laterally encapsulates the first integrated circuit component 100a', the second integrated circuit component 100b' and the electromagnetic interference shielding layer 150a2. Furthermore, the first conductive pillars 130a and the second conductive pillars 130b are accessibly exposed by the insulating encapsulation 210'. In some embodiments, the first integrated circuit component 100a' and the insulating encapsulation 210' are spaced apart by the electromagnetic interference shielding layer 150a2 and the first integrated circuit component 100a' is surrounded by the electromagnetic interference shielding layer 150a2. Furthermore, the second integrated circuit component 100b' is in contact with the insulating encapsulation 210'. The sidewalls of the second integrated circuit component 100b' are not in contact with the electromagnetic interference shielding layer 150a2.

As shown in FIG. 28, the insulating encapsulation 210' is penetrated by the conductive through vias TIV. In other words, the first integrated circuit component 100a', the second integrated circuit component 100b' and the conductive through vias TIV are embedded in the insulating encapsulation 210'.

As shown is FIG. 28, since electromagnetic interference shielding layer 150a2 is formed at chip level, the electromagnetic interference between the first integrated circuit component 100a' and the second integrated circuit component 100b' may be shielded by the electromagnetic interference shielding layer 150a2 before the package is accomplished.

Figure 29:
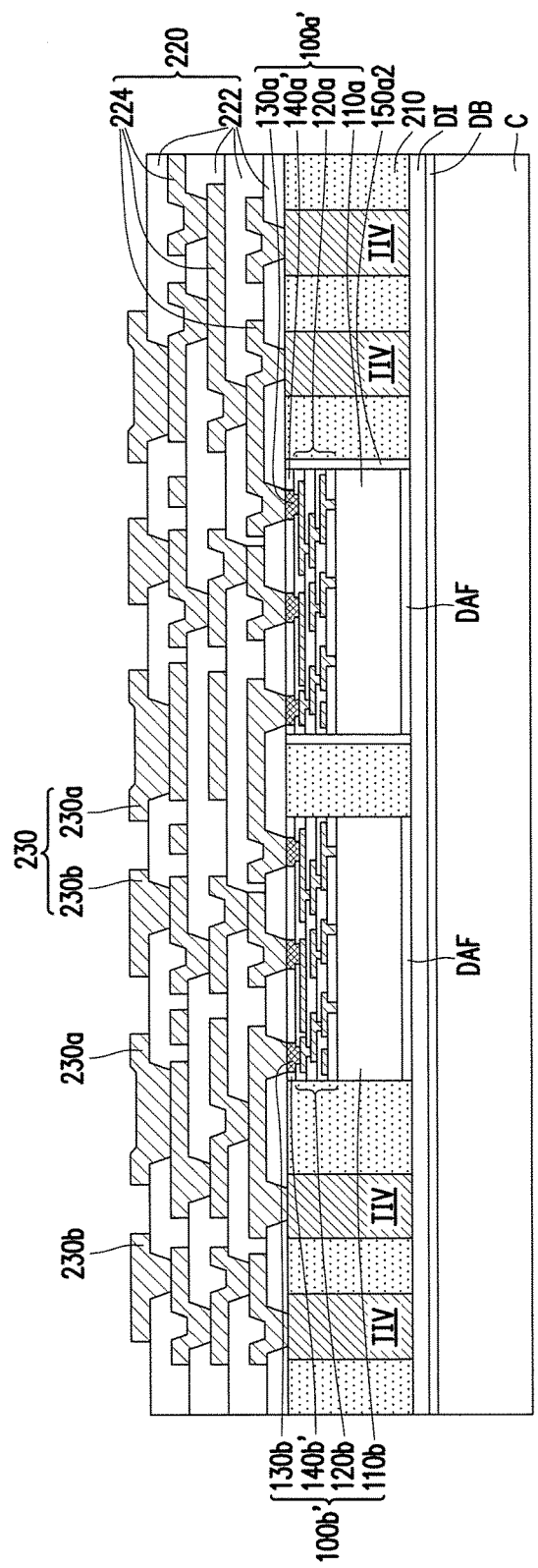

Referring to FIG. 29, a first redistribution circuit structure 220 electrically connected to the first conductive pillars 130a of the first integrated circuit component 100a' and the second conductive pillars 130b of the second integrated circuit component 100b' is formed on the top surfaces of the conductive through vias TIV, a first surface S1 (i.e. the top surface) of the insulating encapsulation 210', the first conductive pillars 130a, the second conductive pillars 130b, the first protection cap 140a' and the second protection cap 140b'. As shown in FIG. 29, the first redistribution circuit structure 220 includes a plurality of dielectric layers 222 and a plurality of redistribution conductive layers 224 stacked alternately.

Referring to FIG. 29, after the first redistribution circuit structure 220 is formed, a plurality of pads 230 are then formed on the topmost redistribution conductive layer 224 of the first redistribution circuit structure 220. The pads 230 include a plurality of under-ball metallurgy (UBM) patterns 230a for ball mount and a plurality of connection pads 230b for mounting of passive components. The pads 230 are electrically connected to the topmost redistribution conductive layer 224 of the first redistribution circuit structure 220.

Figure 30:
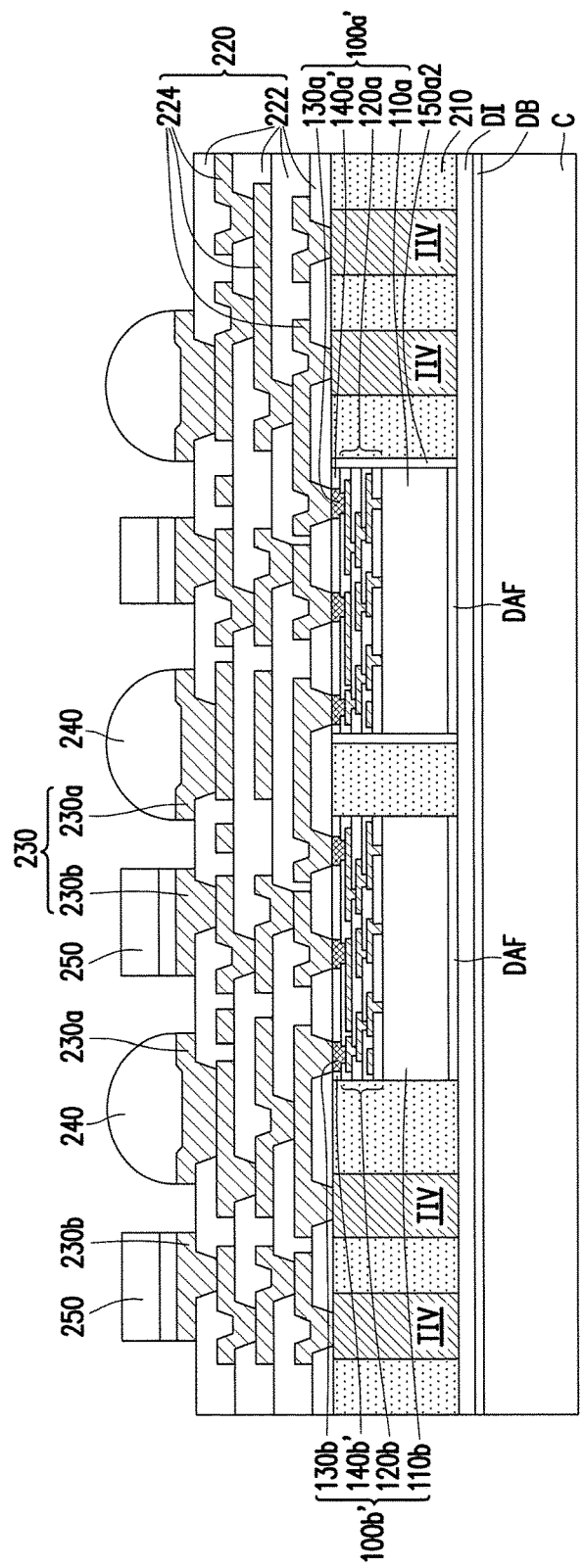

Referring to FIG. 30, after the UBM patterns 230a and the connection pads 230b are formed, a plurality of conductive balls 240 are placed on the under-ball metallurgy patterns 230a, and a plurality of passive components 250 are mounted on the connection pads 230b. In some embodiments, the conductive balls 240 may be placed on the under-ball metallurgy patterns 230a by a ball placement process and the passive components 250 may be mounted on the connection pads 230b through a soldering or reflowing process. In some embodiments, the height of the conductive balls 240 is greater than the height of the passive components 250, for example.

Figure 31:
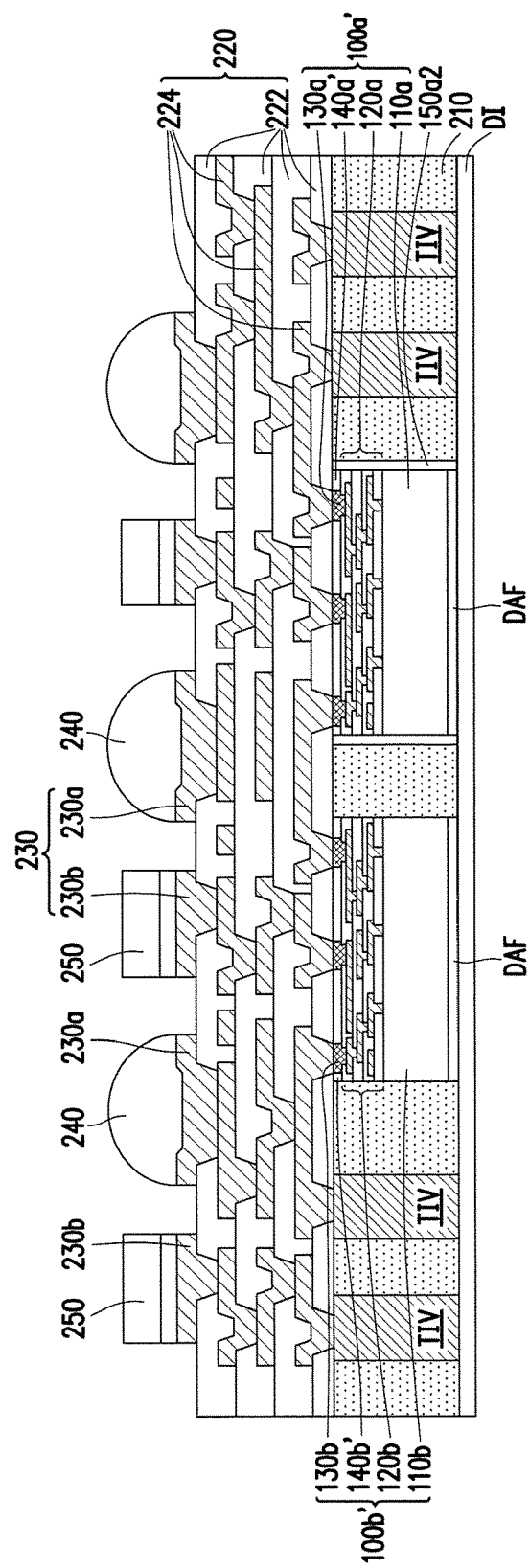

Referring to FIG. 30 and FIG. 31, after the conductive balls 240 and the passive components 250 are mounted on the pads 230, the dielectric layer DI formed on the bottom surface of the insulating encapsulation 210' is de-bonded from the de-bonding layer DB such the dielectric layer DI is separated from the carrier C. In some embodiments, the de-bonding layer DB (e.g., the LTHC release layer) may be irradiated by an UV laser such that the dielectric layer DI is peeled from the carrier C.

Figure 32:
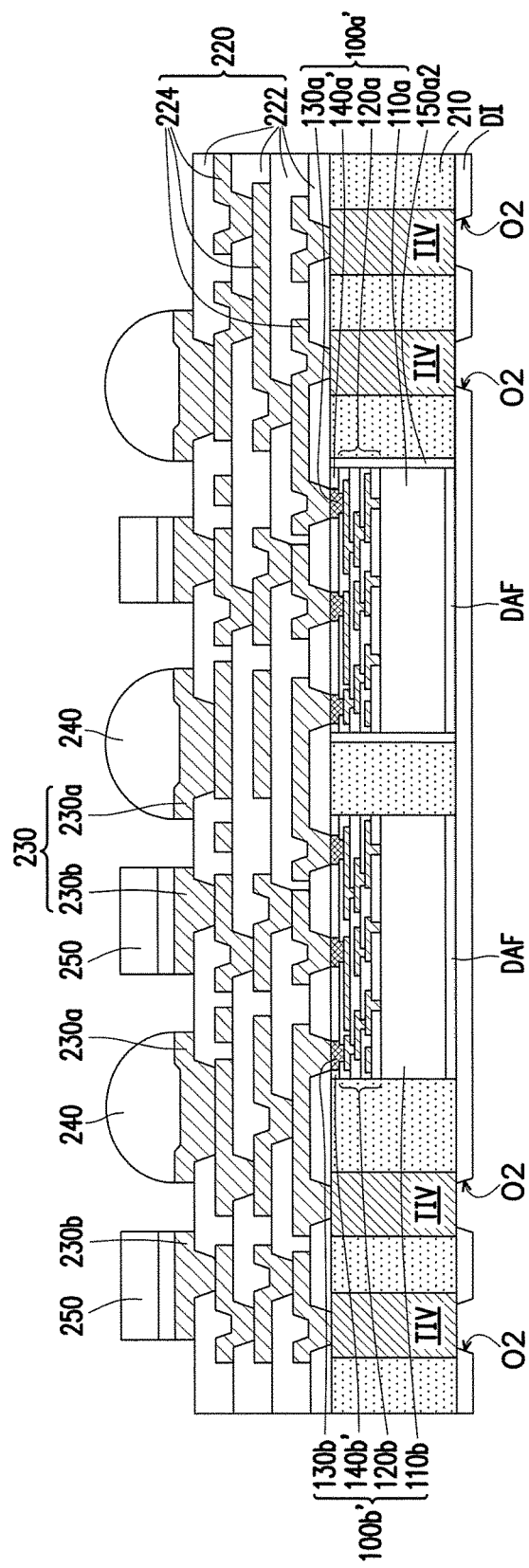

As shown in FIG. 32, the dielectric layer DI is then patterned such that a plurality of contact openings O2 are formed to expose the bottom surfaces of the conductive through vias TIV. The number and position of the contact openings O2 are corresponding to the number of the conductive through vias TIV. In some embodiments, the contact openings O2 of the dielectric layer DI are formed by a laser drilling process or other suitable patterning processes. In some alternative embodiments, the dielectric layer DI may be entirely removed from the bottom surface of the insulating encapsulation 210' so as to expose the bottom surfaces of the conductive through vias TIV.

Figure 33:
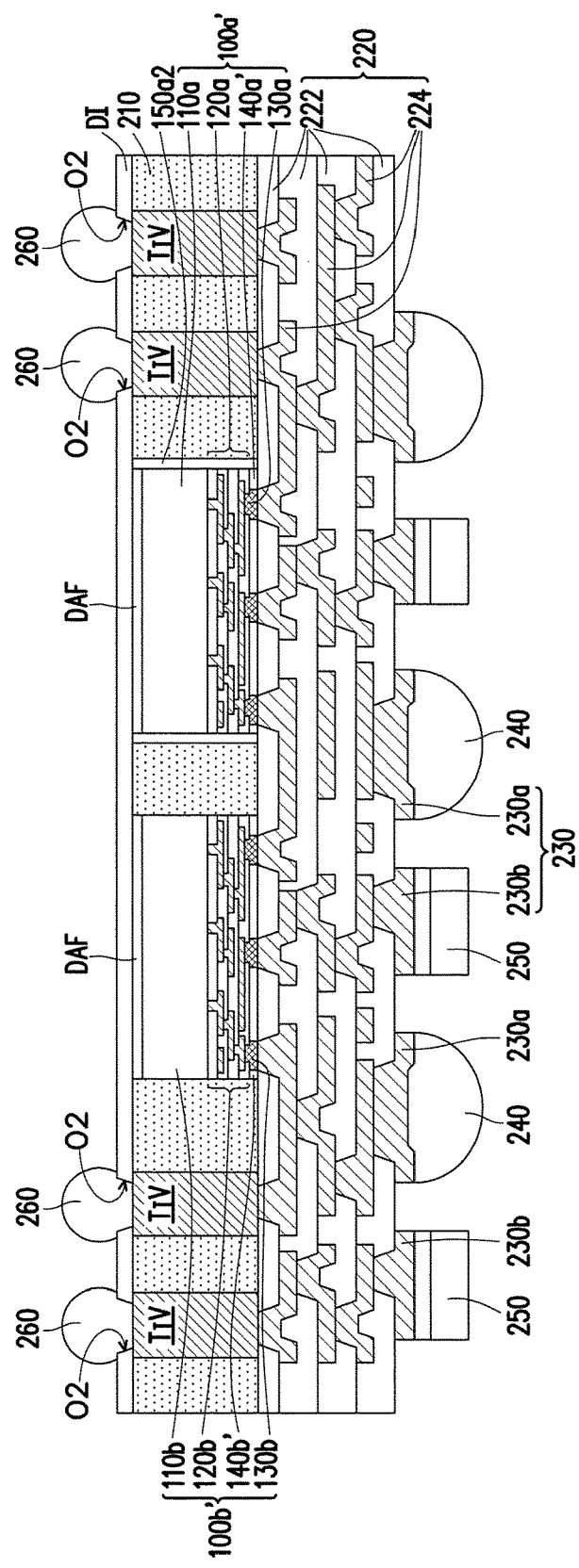

Referring to FIG. 33, after the contact openings O2 are formed in the dielectric layer DI, a plurality of conductive balls 260 are placed on the bottom surfaces of the conductive through vias TIV that are exposed by the contact openings O2. And, the conductive balls 260 are, for example, reflowed to bond with the bottom surfaces of the conductive through vias TIV. As shown in FIG. 33, after the conductive balls 230 and the conductive balls 260 are formed, an integrated fan-out package of the first integrated circuit component 100a' and the second integrated circuit component 100b' is accomplished.

It is noted that the first integrated circuit component 100a' and the second integrated circuit component 100b' may be packaged by the processes illustrated in FIG. 15 through FIG. 25.

In accordance with some embodiments of the present disclosure, an integrated circuit package including at least one integrated circuit component, at least one electromagnetic interference shielding layer and an insulating encapsulation is provided. The at least one integrated circuit component includes an active surface, a plurality of sidewalls connected to the active surface and a plurality of conductive pillars protruding from the active surface. The at least one electromagnetic interference shielding layer covers the sidewalls of the at least one integrated circuit component, and the at least one electromagnetic interference shielding layer is electrically grounded. The insulating encapsulation encapsulates the at least one integrated circuit component and the at least one electromagnetic interference shielding layer, and the conductive pillars of the at least one integrated circuit component are accessibly exposed by the insulating encapsulation.

In accordance with alternative embodiments of the present disclosure, a method of fabricating an integrated circuit package is provided. The method includes: a wafer including a plurality of conductive pillars formed thereon is provided; a protection material layer is formed on the wafer so as to cover the conductive pillars; a wafer dicing process is performed to form a plurality of semiconductor dies, wherein each of the semiconductor dies includes parts of the conductive pillars and a protection cap covering the parts of the conductive pillars; an electromagnetic interference shielding layer is formed to cover sidewalls of at least one of the semiconductor dies; and the at least one of the semiconductor dies and the electromagnetic interference shielding layer are laterally encapsulated with an insulating material.

In accordance with yet alternative embodiments of the present disclosure, a method of fabricating an integrated circuit package is provided. The method includes: a wafer including a plurality of first conductive pillars formed thereon is provided; a first protection material layer is formed on the wafer to cover the first conductive pillars; a wafer dicing process is performed to form a plurality of first semiconductor dies, wherein each of the first semiconductor dies includes parts of the first conductive pillars and a first protection cap covering the parts of the first conductive pillars; an electromagnetic interference shielding layer is formed to cover sidewalls of at least one of the first semiconductor dies; a second semiconductor die and the at least one of the first semiconductor dies are provided on a carrier, wherein the second semiconductor die includes a plurality of second conductive pillars and a second protection cap covering the second conductive pillars; and the electromagnetic interference shielding layer, the at least one of the first semiconductor dies and the second semiconductor die are laterally encapsulated with an insulating material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit package, comprising:
   at least one integrated circuit component comprising an active surface, a plurality of sidewalls connected to the active surface and a plurality of conductive pillars protruding from the active surface;
   at least one electromagnetic interference shielding layer exclusively disposed on and in contact with the sidewalls of the at least one integrated circuit component, the at least one electromagnetic interference shielding layer being electrically grounded; and
   an insulating encapsulation encapsulating the at least one integrated circuit component and the at least one electromagnetic interference shielding layer, and the conductive pillars of the at least one integrated circuit component being accessibly exposed by the insulating encapsulation.

2. The integrated circuit package of claim 1, wherein the at least one integrated circuit component further comprises a protection cap covering the active surface and encapsulating the conductive pillars, top surfaces of the conductive pillars are accessibly exposed by the protection cap and are substantially coplanar with a top surface of the protection cap, and the at least one electromagnetic interference shielding layer further covers sidewalls of the protection cap.

3. The integrated circuit package of claim 1, wherein the at least one integrated circuit component and the at least one insulating encapsulation are spaced apart by the electromagnetic interference shielding layer and the at least one integrated circuit component is surrounded by the at least one electromagnetic interference shielding layer.

4. The integrated circuit package of claim 1 further comprising a first redistribution circuit structure disposed on the top surfaces of the conductive pillars accessibly exposed by the insulating encapsulation and a first surface of the insulating encapsulation, wherein the first redistribution circuit structure is electrically connected to the conductive pillars of the at least one integrated circuit component.

5. The integrated circuit package of claim 4 further comprising:
   a plurality of conductive through vias, wherein conductive through vias penetrate through the insulating encapsulation and are electrically connected to the first redistribution circuit structure.

6. The integrated circuit package of claim 5 further comprising:
   a second redistribution circuit structure disposed on a second surface of the insulating encapsulation, wherein the second surface is opposite to the first surface, and the second redistribution circuit structure is electrically connected to the first redistribution circuit structure through the conductive through vias.

7. The integrated circuit package of claim 6 further comprising:
   a semiconductor device disposed on the second redistribution circuit structure, wherein the semiconductor device is electrically connected to the at least one integrated circuit component through the second redistribution circuit structure, the conductive through vias and the first redistribution circuit structure.

8. The integrated circuit package of claim 1, wherein the at least one integrated circuit component comprises:
   a first integrated circuit component, sidewalls of the first integrated circuit component being in contact with the at least one electromagnetic interference shielding layer; and
   a second integrated circuit component, sidewalls of the second integrated circuit component being not in contact with the at least one electromagnetic interference shielding layer.

9. The integrated circuit package of claim 8, wherein the first integrated circuit component and the insulating encapsulation are spaced apart by the at least one electromagnetic interference shielding layer, and the first integrated circuit component is surrounded by the at least one electromagnetic interference shielding layer.

10. The integrated circuit package of claim 8, wherein the first integrated circuit component and the insulating encapsulation are spaced apart by the at least one electromagnetic interference shielding layer and the second integrated circuit component is in contact with the insulating encapsulation.

11. A method of fabricating an integrated circuit package, the method comprising:
   providing a wafer comprising a plurality of conductive pillars formed thereon;
   forming a protection material layer on the wafer to cover the conductive pillars;
   performing a wafer dicing process to form a plurality of semiconductor dies, each of the semiconductor dies comprising parts of the conductive pillars and a protection cap covering the parts of the conductive pillars;
   forming a conductive layer on at least one of the semiconductor dies, the conductive layer being in contact with the protection cap and sidewalls of the at least one of the semiconductor dies;
   encapsulating the at least one of the semiconductor dies and the conductive layer with an insulating material; and
   partially grinding the insulating material, the conductive layer and the protection cap until the conductive pillars are exposed, wherein an electromagnetic interference shielding layer in contact with the sidewalls of the at least one of the semiconductor dies is formed after the conductive layer is partially grounded.

12. The method of claim 11, wherein
   after partially grinding the insulating material, the conductive layer and the protection cap, an integrated circuit component and an insulating encapsulation are formed, and the insulating encapsulation laterally encapsulates the integrated circuit component and the electromagnetic interference shielding layer.

13. The method of claim 12 further comprising:
   forming a first redistribution circuit structure on a first surface of the insulating encapsulation and the conductive pillars which are exposed by the insulating encapsulation, wherein the redistribution circuit structure is electrically connected to the conductive pillars of the integrated circuit component.

14. The method of claim 12 further comprising:
forming a plurality of conductive through vias penetrating through the insulating encapsulation.

15. The method of claim 13 further comprising:
forming a second redistribution circuit structure on a carrier before providing the at least one of the semiconductor dies on the carrier, wherein the second redistribution circuit structure is disposed on a second surface of the insulating encapsulation, the second surface is opposite to the first surface, and the second redistribution circuit structure is electrically connected to the first redistribution circuit structure through the conductive through vias.

16. A method of fabricating an integrated circuit package, the method comprising:
providing a wafer comprising a plurality of first conductive pillars formed thereon;
forming a first protection material layer on the wafer to cover the first conductive pillars;
performing a wafer dicing process to form a plurality of first semiconductor dies, each of the first semiconductor dies comprising parts of the first conductive pillars and a first protection cap covering the parts of the first conductive pillars;
forming a conductive layer on at least one of the first semiconductor dies, the conductive layer being in contact with the first protection cap and sidewalls of the at least one of the first semiconductor dies;
providing a second semiconductor die and the at least one of the first semiconductor dies on a carrier, wherein the second semiconductor die comprises a plurality of second conductive pillars and a second protection cap covering the second conductive pillars; and
encapsulating the conductive layer, the at least one of the first semiconductor dies and the second semiconductor die with an insulating material; and
partially grinding the insulating material, the conductive layer, the first protection cap and the second protection cap until the first and second conductive pillars are exposed, wherein an electromagnetic interference shielding layer in contact with the sidewalls of the at least one of the first semiconductor dies is formed after the conductive layer is partially grounded.

17. The method of claim 16, wherein
after partially grinding the insulating material, the conductive layer, the first protection cap and the second protection cap, at least one first integrated circuit component, a second integrated circuit component, and an insulating encapsulation are formed, and the insulating encapsulation laterally encapsulates the at least one first integrated circuit component, the second integrated circuit component and the electromagnetic interference shielding layer.

18. The method of claim 16 further comprising:
forming a first redistribution circuit structure on a first surface of the insulating encapsulation, the first and second conductive pillars which are exposed by the insulating encapsulation, wherein the redistribution circuit structure is electrically connected to the first conductive pillars of the at least one first integrated circuit component and the second conductive pillars of the second integrated circuit component.

19. The method of claim 18 further comprising:
forming a plurality of conductive through vias penetrating through the insulating encapsulation.

20. The method of claim 19 further comprising:
forming a second redistribution circuit structure on the carrier before providing the second semiconductor die and the at least one of the semiconductor dies on the carrier, wherein the second surface is opposite to the first surface and the second redistribution circuit structure is electrically connected to the first redistribution circuit structure through the conductive through vias.

* * * * *